United States Patent [19]
Machado et al.

[11] Patent Number: 5,255,136
[45] Date of Patent: Oct. 19, 1993

[54] HIGH CAPACITY SUBMICRO-WINCHESTER FIXED DISK DRIVE

[75] Inventors: Michael G. Machado, Boulder, Colo.; Ronald R. Moon, Los Gatos, Calif.; Thomas A. Tacklind, San Martin, Calif.; William G. Moon, Saratoga, Calif.; Bruce R. Peterson, San Jose, Calif.; Clifford M. Gold, Fremont, Calif.; Daniel E. Barnard, San Jose, Calif.; James H. Do, Milpitas, Calif.

[73] Assignee: Quantum Corporation, Milpitas, Calif.

[21] Appl. No.: 710,171

[22] Filed: Jun. 4, 1991

Related U.S. Application Data

[63] Continuation-in-part of Ser. No. 569,065, Aug. 17, 1990, Pat. No. 5,170,299, which is a continuation-in-part of Ser. No. 650,791, Feb. 1, 1991, Pat. No. 5,241,546.

[51] Int. Cl.⁵ .................. G06F 1/00; G11B 5/584
[52] U.S. Cl. .................. 360/77.02; 360/77.05; 360/77.08
[58] Field of Search ............ 360/77.02, 77.05, 77.08, 360/75

[56] References Cited

U.S. PATENT DOCUMENTS

| | | | |
|---|---|---|---|
| 3,299,411 | 1/1967 | Capozzi et al. | 340/172.5 |
| 4,016,603 | 4/1977 | Ottesen | 360/135 |
| 4,669,004 | 5/1987 | Moon et al. | 360/77 |
| 4,819,153 | 4/1989 | Graham et al. | 360/75 |
| 4,890,174 | 12/1989 | Chalmers et al. | 360/77.05 |
| 4,933,785 | 6/1990 | Morehouse et al. | 360/78.04 |
| 5,005,089 | 4/1991 | Thanos et al. | 360/77.05 |
| 5,025,335 | 6/1991 | Stefansky | 360/97.01 |
| 5,025,336 | 6/1991 | Morehouse et al. | 360/97.02 |
| 5,153,786 | 10/1992 | Sidman | 360/77.02 |
| 5,170,299 | 12/1992 | Moon | 360/77.08 |

FOREIGN PATENT DOCUMENTS 0471314 2/1992 European Pat. Off. .

OTHER PUBLICATIONS

Cirrus Logic Preliminary data sheet CL-SH350, Nov. 1989 pp. 1-116.
National Semiconductor Preliminary Data Sheet, DP 8491.
Hard Disk Data Path Electronics, Sep. 5, 1991 pp. 1-99.
Silicon Systems Preliminary Data Sheet, SSI 32C452.
Storage Controller, Jul. 1990, pp. 7-23 to 7-54.

Primary Examiner—Timothy P. Callahan
Attorney, Agent, or Firm—David B. Harrison

[57] ABSTRACT

A miniature disk drive achieves storage densities of at least approximately 1700 tracks per inch per storage surface of a storage disk defining a series of radially extensive servo sectors embedded within circumferential zones of data tracks. The sectors are recorded at a constant data transfer rate while each zone has a data transfer rate adapted to disk radius. The drive includes a head and head positioner, a read preamplifier for amplifying analog signals read from, and for amplifying signals to be written to, a storage surface. A circuit board carries drive electronics including a read channel, a servo processing circuit for recovering head location information from the servo sectors, a data block sequencer for sequencing data blocks between a buffer and the storage surface, a buffer memory controller for controlling the buffer, a bus level interface circuit for transferring data blocks between the buffer and a host computer, and a programmed digital controller which functions within a head position servo loop and which also controls the sequencer, buffer controller and bus level interface circuit. As one feature, the servo sectors split data blocks into segments. Segment byte counts in each data block header are used by the sequencer automatically to assemble the segments into data blocks during read and to divide the blocks into segments during write. A single VLSI circuit including the sequencer, servo processing circuit, memory controller and an interface to the microcontroller is disclosed.

30 Claims, 18 Drawing Sheets

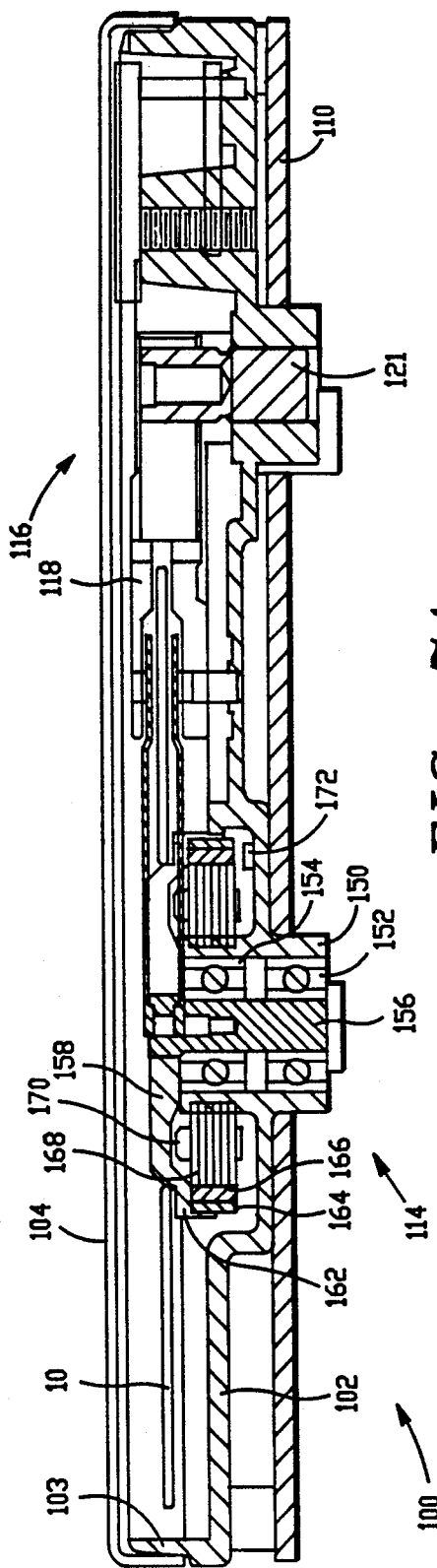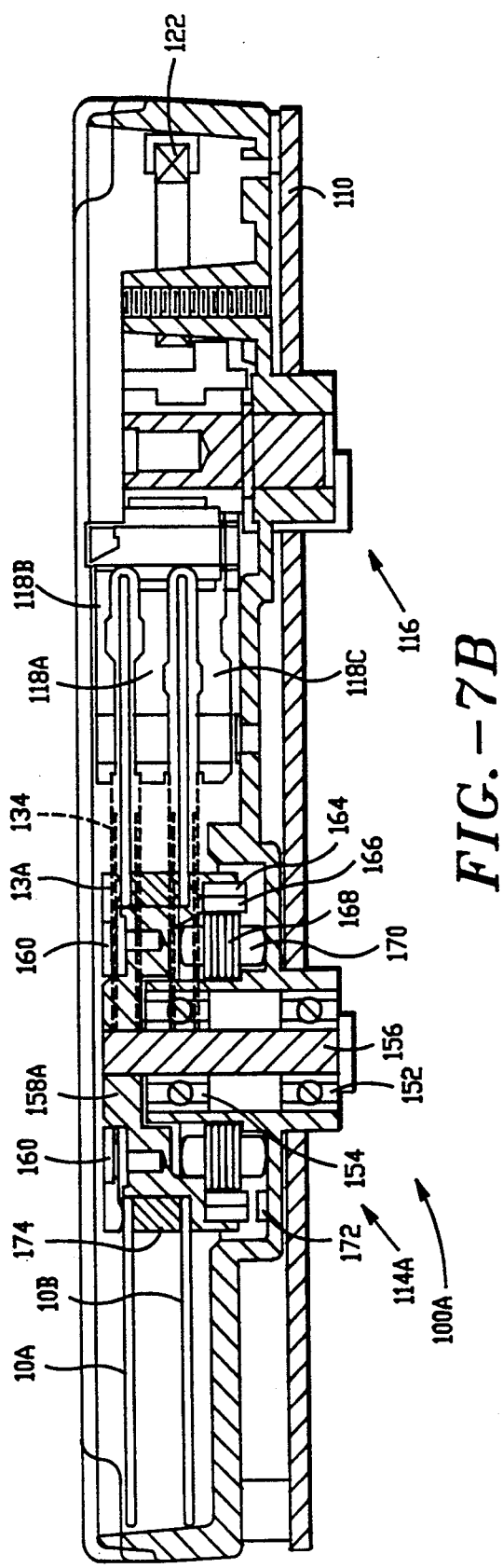

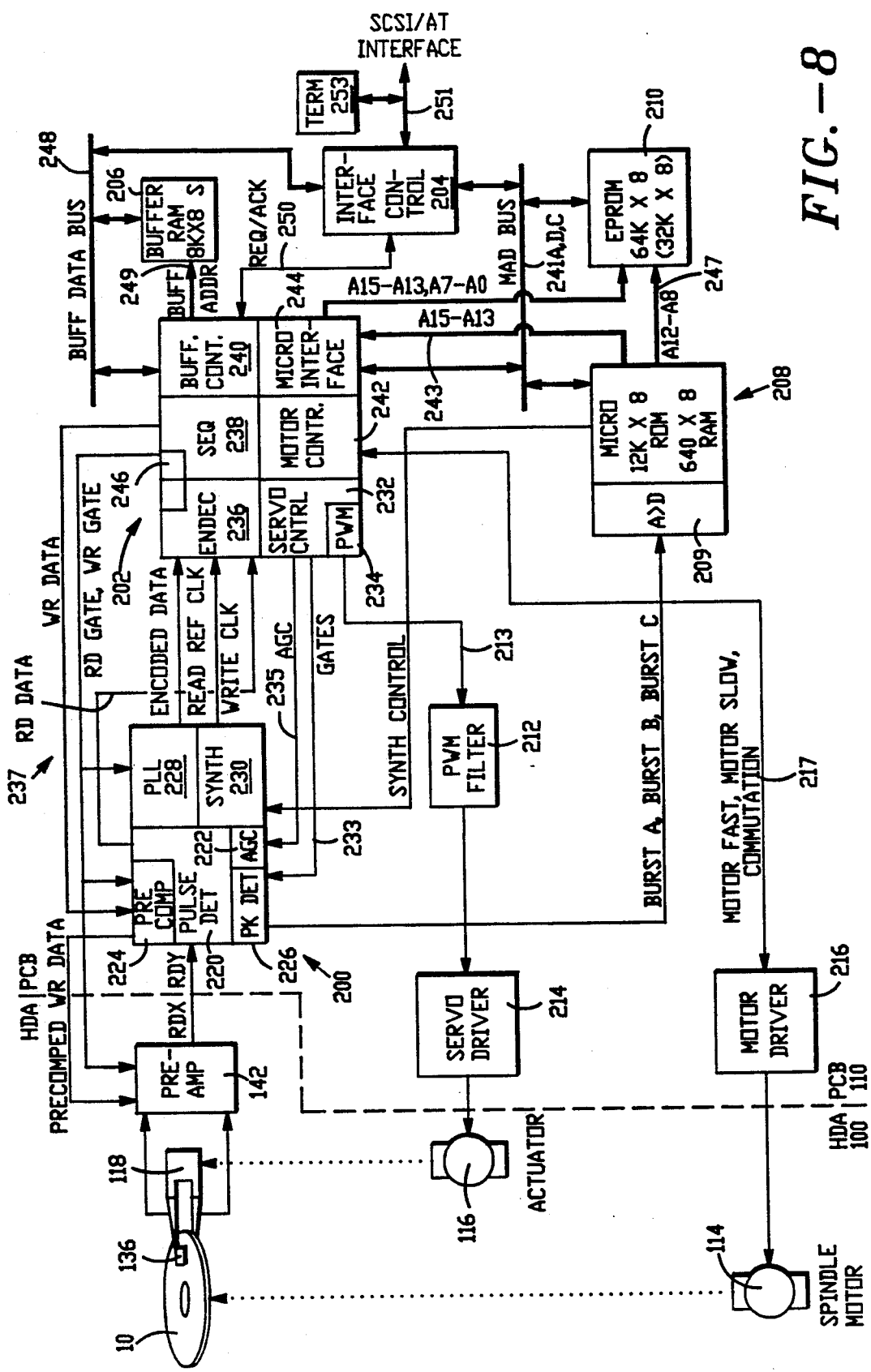

HIGH CAPACITY SUBMICRO-WINCHESTER FIXED DISK DRIVE

REFERENCE TO RELATED APPLICATIONS

The present application is a continuation in part of U.S. patent application Ser. No. 07/569,065 filed on Aug. 17, 1990, now U.S. Pat. No. 5,170,299; and is a continuation in part of U.S. patent application Ser. No. 07/650,791 filed on Feb. 1, 1991 now U.S. Pat. No. 5,241,546.

REFERENCE TO MICROFICHE APPENDIX

Reference is made to a microfiche appendix accompanying this patent application containing microcontroller routine program listings and detailed schematic circuit diagrams of a circuit board and a disk drive data sequencer circuit embodying principles of the present invention.

FIELD OF THE INVENTION

The present invention relates to high capacity, high performance miniature fixed disk drive data storage subsystems. More particularly, the present invention relates to a high capacity, submicro-Winchester fixed disk drive employing embedded sector servo head positioning and automatic decoding and sequencing of split data fields.

BACKGROUND OF THE INVENTION

Disk drives, particularly fixed disk drives, are valued on the basis of several factors including size (i.e. sometimes referred to as "form factor"), data storage capacity, random access times between data fields located in disparate concentric data tracks of the storage disk (i.e. sometimes referred to as "access time" or "average access time"), cost per byte stored, and useful life (i.e. sometimes rated as "mean time between failures").

When data tracks are arranged as concentric circles on a circular storage surface, outer tracks or circles are longer and therefore have more useful magnetic storage domains than inner tracks. Also, when storage disks are rotated at a constant angular velocity, the data transducer head "flies" at a faster and somewhat higher altitude above outer storage tracks where relative head to disk velocity is greater, than inner tracks.

One known way to increase data storage capacity is to divide the data storage surface into radial zones of tracks, and to optimize data transfer rate to the smallest track (innermost track) within each particular zone. This approach is sometimes called "zoned data recording". The number of data sectors or fields typically may vary from zone to zone. In order to switch from zone to zone, it is necessary for the disk drive to adapt itself in real time to the number of data sectors and to the new data rate applicable in the particular zone.

Other known ways to increase data storage capacity include varying disk rotation in function of radial position of the data transducer head while maintaining data transfer rate substantially constant as is done with optical disk technology; and, varying data transfer rate with each track in function of the radial position of the head, while maintaining disk rotation constant, as is commonly employed in "flying head" or Winchester fixed disk technology.

Issues confronting the designer of a disk drive include head positioning, and data block transfer. Head positioning is typically carried out by a head positioner servo mechanism and involves "track seeking operations" for moving the data transducer head from a departure track to a destination track throughout the radial extent of the storage area of the disk; and, "track following operations" for causing the data transducer head to follow precisely a particular data track during data block reading/writing operations. In order to provide precise head positioning, during both seeking and following, some servo information must be provided to the head positioner servo. This information may be contained on a special data surface written exclusively with servo information, (called a "dedicated servo surface"), or it may be externally supplied as by an optical encoder coupled to the head positioner arm, or it may be supplied from servo information interspersed or "embedded" among the data fields within each data track. One other approach worth mentioning is provided by the open loop stepper motor head positioner servo wherein positional stability of the head at each selected data track location is provided by electromagnetic detents of the stepper motor.

When servo information is embedded on a data surface having zoned data recording, complications arise in reliably providing robust servo head position information. There must be sufficient embedded information to provide stability to the servo loop and to provide position feedback during high speed portions of track seeking operations, so that velocity or position profiles may be adjusted, based on present head velocity or position at the time of the sample. If the servo information is recorded at the same data rate, and in positional relationship with the data blocks, as has been conventionally employed, the servo architecture is complex in the sense of having to switch data rate and servo position, as zones are crossed over. One example of data zones with switched servo sector locations is provided by the disclosure of Ottesen U.S. Pat. No. 4,016,603, for example. If the servo information is regularly spaced radially across the data storage surface and splits at least some of the data fields into segments, complications arise in reading each split data field as a single data block without error. Also, the disk rotational velocity must be monitored and carefully maintained at a predetermined constant angular velocity.

Data fields are conventionally managed by a data sequencer. One example of a data sequencer is to be found in commonly assigned U.S. Pat. No. 4,819,153, the disclosure thereof being incorporated herein by reference. The data sequencer may include an encoder/decoder for transforming NRZ data into a coded data format, such as 1,7 RLL code in order to achieve compression of data relative to flux transition density on the data surface. (1,7 RLL coding results in an overall four to three data compaction and therefore permits more data to be recorded on the disk per the number of flux transitions that may be contained within the magnetic storage domains.)

A data sequencer conventionally performs the task of decoding data sector overhead information in order to locate a desired storage location, and to obtain information relating to the correctness or validity of data read back from the storage location. Typically implemented as a state machine, a data sequencer conventionally monitors incoming data flow to locate a data ID preamble field, a data ID address mark, a sector ID field, the data field itself, and usually some small number of error correction syndrome bytes appended to the end of the data field. The sequencer commands appropriate action be taken when each of the fields is located. For example, if a data block from the data field of a particular track and sector is being sought, the sequencer compares incoming sector ID field information with the sought-after sector information stored in a register. When a positive comparison occurs, the sequencer causes the bytes read from the data field via a data transducer head and a read channel to be sent into a block buffer memory, and the error correction syndrome remainder bytes to be checked. If there are no detected errors in the data bytes as determined by analyzing the ECC remainder bytes, the block is then sent from the buffer memory to the host computer via a suitable interface, such as SCSI.

In the disk drive described in the referenced U.S. Pat. No. 4,669,004, each sector was handled individually in response to specific input from the supervisory microcontroller. As a particular sector was read, the microcontroller would inform the sequencer whether or not to read the next data sector. This microcontroller intervention occurred for every sector.

In a later design, of which the disclosure found in commonly assigned U.S. Pat. No. 5,005,089, is incorporated herein by reference, a programmable sector counter was preset by the microcontroller to a desired sector count, and the sequencer then processed sectors sequentially until the count in the sector counter was reached. The disk drive examples found in the referenced '004 and '153 patents did not include the complication of zoned data recording and split data fields, and the '089 patent did not include embedded servo sectors. Positioner stability in the '089 disk drive example was provided by an optical encoder coupled between a rotary head positioner and the drive base, as was the case of the disk drive example described in the referenced '153 patent.

Heretofore, while split data recording schemes have been proposed in the prior art, recent have typically tasked the data microcontroller with the responsibility for managing each split data field layout in real time,- leading to a tremendous level of bus traffic between the microcontroller and the data sequencer during data read and write operations, and precluding the microcontroller from performing other very useful tasks, such as those related to head position servo supervision, error correction, command and status exchanges with the host computer over the interface bus structure, to cite a few examples. These prior approaches have therefore employed either a separate data transfer microprocessor, or have sustained a significant reduction or impairment in performance.

As disk drive form factors become smaller and smaller, driven by storage needs of compact, lightweight and powerful notebook computers and intelligent notepads, the amount of space and power available for data storage and for support electronics is increasingly diminished. Disk drives having very small form factors, such as those of the 2 ½ inch or 1.8 inch disk diameter form factor, typically have room for limited magnetic storage cells or domains and support circuitry space is very constrained, leading to a minimum of discrete circuit components, such as only one microcontroller element, and a limited external bus structure to manage both head position servo information and also manage data block exchanges with the host over a high level bus interface structure, such as SCSI. While downsize scaling of prior technologies and approaches has been proposed to realize smaller disk drives, see e.g. U.S. Pat. No. 4,933,785, scaling by itself has not resulted in higher capacity, higher performance disk drives within the size-reduced form factor, simply because there is less room on the reduced diameter data storage disk for storing the desired amount of information. Yet, most contemporary full capability computing systems and applications require a minimum of about 40 Megabytes of formatted, hard disk data storage capacity.

Heretofore there has been no practical, efficient way to provide a miniaturized disk drive employing a uniquely selected combination of structural elements and functional features to realize higher data storage capacity and performance within a reduced size form factor, such as 2.5 inch or smaller disk diameter.

SUMMARY OF THE INVENTION WITH OBJECTS

A general object of the present invention is to provide an improved miniaturized disk drive overcoming limitations and drawbacks of the prior art.

Another general object of the present invention is to provide a highly miniaturized and size reduced submicro-Winchester fixed disk drive with increased data storage capacity and performance by uniquely combining structural elements and functional features, some of the elements and features being individually known in the prior art and others being unique in and of themselves.

A more specific object of the present invention is to provide a disk drive employing zoned data recording having data fields split into segments by intervening embedded servo sectors and having on-the-fly sequencing for writing data to and reading data from the split data fields in a manner which overcomes limitations and drawbacks of the prior art approaches.

Another specific object of the present invention is to provide a unique identification field for each data sector which supports directly on-the-fly data sequencing through each split data field without direct microprocessor intervention.

Another specific object of the present invention is to provide an improved data sequencer state machine for a disk drive which autonomously sequences through split data fields without requiring constant intervention by a microcontroller element to decode the particular format of each split data field, thereby freeing the microcontroller to perform other useful tasks.

One more specific object of the present invention is to provide an arrangement of application specific integrated circuits which integrate and tightly couple circuitry comprising disk drive operating elements regarding data read/write channel, disk data sector formatting, data flow between the storage disk and a buffer memory during data writing and reading operations, disk data flow between the buffer memory and an interface leading to a host computer, head positioning during head positioning operations, and spindle motor speed, for example.

A submicro-Winchester disk drive data storage subsystem for storing at least 40 megabytes of formatted user data on a single disk and at least 80 megabytes on two disks by incorporating principles of the present invention includes a bus-level interface circuit for connecting with a host computing system, at least one rotating disk having data storage surfaces defining a plurality of concentric data storage track locations, a data transducer head for each surface, the heads being radially positionable among the track locations, a head positioning system for moving the data transducer heads between track locations during track seeking and settling, and for maintaining a selected one of the data transducer heads in alignment with centerline of a track during track following operations during which data blocks are written to or read from the track being followed. Each data block includes an ID field containing block segment counts indicative of the spatial arrangement of said block. The storage surfaces define a series of radially extensive servo sectors embedded within the data tracks at predetermined spaced apart circumferential locations across a data storage surface areas of the disk and thereby split at least some of the data blocks into segments. The subsystem further comprises a servo processing circuit for locating and processing servo information located within each servo sector to determine present location of the data transducer head and to put out head position digital values indicative thereof, a buffer memory connected to the interface circuit for temporarily storing data blocks being transferred between the system and the subsystem via the interface circuit, a data block sequencer directly responsive to the block segment counts for locating and assembling data blocks read from and written to the data storage surfaces and for handling data block transfers between the disk storage surfaces and the buffer memory, a buffer memory controller for handling transfers between the buffer memory, the data sequencer, and the interface circuit, a programmed digital controller including servo supervision routines for supervising operations of the servo processing means by generating and applying digital head position values to the head positioning system from the head position digital values generated by the servo processing circuit, and including data block transfer supervision routines for supervising operations of the data block sequencer, the buffer memory controller and the interface circuit.

Another facet of the present invention is found in a data storage pattern for a high capacity, submicro-Winchester disk drive including a storage disk rotating at substantially constant angular velocity and having at least one storage surface defining a multiplicity of concentric data tracks, and a data transducer head positionable at each of the tracks by a head positioning mechanism operating within a digital servo loop. The data storage pattern comprises a series of circumferentially spaced apart, radially extending servo sectors, each servo sector being prerecorded with flux transition patterns defining a servo address mark, a servo sector identification number and servo centerline information, the transition patterns defining the sector identification number and the servo centerline information being resolvable by the disk drive into digital numbers representing head position relative to a said concentric track containing the particular sector. The data tracks are grouped into a plurality of concentric track zones, each zone having a data transfer rate related to radial offset of said zone from a center of rotation of the disk. Each track within a zone is soft-formatted into a predetermined number of data sectors of predetermined user data block storage length. At least some of said sectors are interrupted by at least one of the servo sectors into data segments. Each data sector has a data sector identification field including a plurality of user byte count values indicating the user data storage capacity of each segment of the sector. The count values may therefore be read by the disk drive on-the-fly in order to read a user data block from, and to write a user data block to, the segments.

In one aspect of this facet of the invention, each segment of a data sector includes a preamble field including an address mark, and each said data sector which is divided into plural segments by at least one servo sector includes a data sector identification field as a preamble of a first segment, and a subsequent segment includes a data preamble including a data segment address mark. The data segment address mark is preferably different than the address mark contained within the data sector identification field.

In another aspect of this facet of the invention, the preamble field includes a predetermined sync pattern for enabling a phase locked loop within a data separator of said disk drive to resolve the data transfer rate of the zone of the track containing the particular field, the address mark, an identification field including said count values, a sector and head identifier field for enabling the disk drive to resolve the particular sector location among the multiple data sectors, and an error detection field for enabling an error correction circuit of the disk drive to verify correctness of the values contained within the preamble field.

As a further facet of the present invention, a monolithic VLSI integrated circuit is provided for a disk drive data storage subsystem. The subsystem includes a disk rotating at a controlled, substantially constant angular velocity and defining a multiplicity of concentric data tracks; a head for reading data from a said track and for writing data to a said track, the head being positioned by a head positioning mechanism operating within a digital head position servo loop including a programmed digital microcontroller; and, a read/write channel extending between the integrated circuit and the head. A buffer memory is connected between the integrated circuit and an interface circuit for connecting the subsystem with a host computing system via a bus level interface. The monolithic VLSI integrated circuit includes a data sequencer for sequencing blocks of data to and from the disk at defined data block storage locations thereof, a memory controller for generating and putting out addresses to the buffer memory for enabling the buffer memory to transfer data blocks to and from the sequencer, a digital servo decoder responsive to servo information embedded in servo sectors prerecorded on the data surface across the data tracks for decoding the embedded sector information read by the head and putting out digital head position values to said programmed microcontroller means, and a microcontroller interface for enabling said programmed microcontroller to have direct access to storage locations of the integrated circuit for storing control values for said data sequencer, the memory controller and the digital servo decoder.

As aspects of this facet of the invention, the monolithic VLSI integrated circuit the servo information embedded in servo sectors may include in one of the servo sectors a unique index pattern denoting a once-per-revolution index marker. The digital servo decoder decodes the unique index pattern into the index marker. The chip further comprises a disk rotational speed monitoring and adjustment circuit responsive to the index marker for generating speed up and slow down control signals for controlling a spindle motor driver circuit. The chip may further include a pulse width modulator controlled by the programmed microcontroller for generating servo control pulses of controlled duration and applying the control pulses to a servo actuator driver circuit within the head positioner. The chip may further include a programmable master clock for generating programmable clocking signals for controlling operation of the microcontroller, the memory controller and an interface state machine within the interface circuit. The data sequencer within the chip may include an encoder/decoder for encoding and decoding user data values into and from a predetermined zero run length limited code, such as a 1,7 RLL code having a 3 data bits to 2 code bits data compression ratio.

Another facet of the present invention comprises a submicro-Winchester fixed disk drive having at least one data storage disk with a diameter not substantially greater than 2.5 inches and a formatted user data storage capacity of not less than about 40 megabytes per storage disk. The disk rotates at a controlled substantially constant angular velocity. A data transducer head reads data from and writes data to data sectors of concentric data tracks defined on a surface of the disk. A mass balanced rotary voice coil actuator is included for positioning the data transducer head at each selected one of the data tracks for data reading and writing operations. The actuator is controlled by a digital servo control loop. The disk surface further defines a plurality of radially extending, circumferentially spaced apart servo sectors containing prerecorded servo flux transitions at a constant data transfer rate. The flux transitions define a plurality of fields including a servo sync field, a servo address mark field, a servo data field and plural servo centerline burst fields. The data tracks are arranged in plural circumferential zones wherein each zone has a data transfer rate selected in relation to radial displacement of the zone from a center of rotation of the disk. At least some of the data tracks in at least some of the zones are split into segments by one or more of the servo sectors. The disk drive comprises:

a read/write channel connected to the data transducer head for converting digital pulses into analog transitions to be writtent to said surface during data writing operations and for converting analog transitions detected by the data transducer head into pulse transitions, a servo digital decoding and processing circuit connected to the read/write channel for locating and decoding into digital head position values the servo flux transitions located within each servo sector to determine present location of the data transducer head and to put out head position digital values indicative thereof, a host interface circuit for communicating with a host computing system via a bus level interface, a buffer memory connected to the host interface circuit for temporarily storing data blocks being transferred between the system and the subsystem via the interface circuit, a data block sequencer connected to the read/write channel and directly responsive to the block segment counts for locating and assembling in real time from the segments the data blocks read from and written to the data storage surfaces and for handling data block transfers between the disk storage surfaces and the buffer memory, a buffer memory controller for handling transfers between the buffer memory and the interface circuit, and a programmed digital controller including servo supervision routines responsive to the servo digital decoding and processing circuit for generating and applying digital head position values to a voice coil actuator driver circuit from the head position digital values generated by the servo processing circuit, and including data block transfer supervision routines for supervising operations of said data block sequencer, the buffer memory controller and the interface circuit.

As aspects of this facet of the invention, each said data sector has a data sector identification field including a plurality of user byte count values indicating the user data storage capacity of each said segment thereof, and the data block sequencer includes a register stack for receiving the user byte count values and a segment counter responsive to a byte clock and preloaded on-the-fly with a particular user byte count value for a present segment supplied from said register stack. Also, the read/write channel may comprise a first monolithic integrated circuit including a read preamplifier/write driver amplifier, a second monolithic integrated circuit chip including a pulse detector, a phase locked loop, and a frequency synthesizer supporting zoned data transfer rates, and a third monolithic VLSI integrated circuit including the servo digital decoding and processing circuitry, the data block sequencer and buffer memory control. The third chip may also include a spindle speed monitoring and correction signal generating circuit connected to the servo digital decoding and processing circuitry for monitoring a once-per-revolution index pattern recorded in a said servo sector and for generating and putting out a disk speed correction control signal to a disk spindle motor driver circuit controlling operation of a brushless DC spindle motor rotating the disk at the substantially constant angular velocity. Also, the third chip may include a microcontroller interface. The drive further comprises a control bus structure between the programmed microcontroller, the second chip, the microcontroller interface of the third chip, and the host interface circuit; and further comprises a data transfer bus structure between the third chip, the buffer memory and the interface circuit.

As one other aspect of this facet of the invention, the submicro-Winchester data storage subsystem comprises a single data storage disk and is included entirely within a form factor in a horizontal orientation of a height substantially not greater than 0.61 inch, a width substantially not greater than 2.76 inches, and a depth substantially not greater than 3.94 inches.

As another aspect of this facet of the invention, submicro-Winchester disk drive data storage subsystem comprises two data storage disks mounted in spaced apart relation on said hub and is included entirely within a form factor in a horizontal orientation of a height substantially not greater than 0.75 inch, a width substantially not greater than 2.76 inches, and a depth substantially not greater than 3.94 inches.

These and other objects, advantages, aspects and features of the present invention will be more fully understood and appreciated by those skilled in the art upon consideration of the following detailed description of a preferred embodiment, presented in conjunction with the accompanying drawings.

BRIEF DESCRIPTION OF THE DRAWINGS

In the Drawings:

FIG. 7 is a side view in elevation and section of the FIG. 6 head and disk assembly.

FIG. 7A is a side view in elevation and section of a two-disk alternative submicro-Winchester head and disk assembly.

FIG. 8 is an overall block diagram of an electrical control system for the miniature disk drive incorporating principles of the present invention.

DETAILED DESCRIPTION OF A PREFERRED EMBODIMENT

Figure 1:
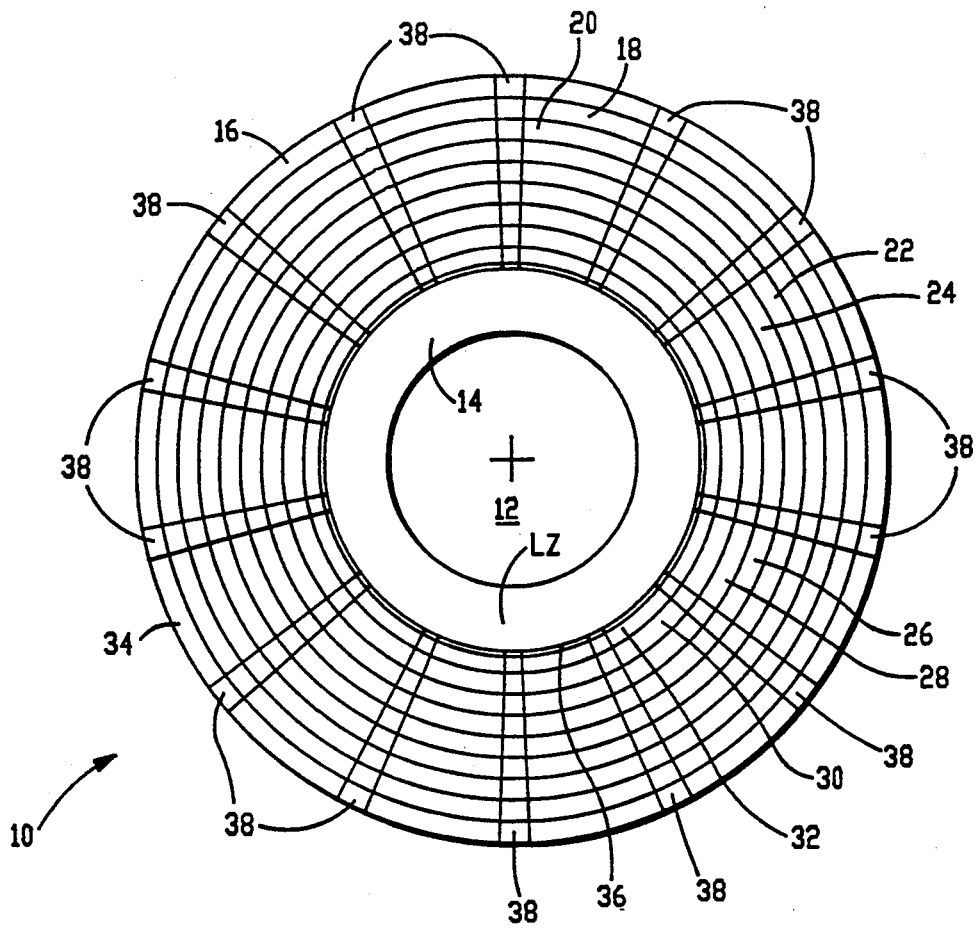
FIG. 1 is a plan view of a disk data storage surface including data track zones and radially/circumferentially aligned embedded servo sectors in accordance with the principles of the present invention.

A submicro-Winchester data storage system 5 in accordance with principles of the present invention provides in a single disk version (FIG. 7A) a formatted storage capacity of approximately 42.9 megabytes, while a two disk version (FIG. 7B) doubles the formatted storage capacity to approximately 86.3 megabytes. The drive 5, including spindle motor, head position and embedded data controller electronics achieves a very low profile, which is optimized to the number of storage disks employed. A synchronous data transfer rate of up to 4.0 megabytes per second is achieved through a high level interface, such as SCSI or IDE (AT). An average seek time of approximately 19 milliseconds is realized. On-board look-ahead data caching during both data read and data write operations is achieved by virtue of a cache buffer memory, which may be from eight kilobytes up to 32 kilobytes. Briefly, write caching is accomplished by signalling a write-completion status to the host while data actually remains in the buffer and before it is recorded on the disk. Read caching occurs by reading additional data blocks from the disk into the cache buffer in addition to the block(s) actually requested by the host.

An on-the-fly error correction coding scheme, together with automatic data sequencing and error detection of data ID fields, is achieved with automatic retrys on read errors. Media defect mapping is handled on a basis which is transparent to the user by virtue of a high performance, in-line defective data sector skipping arrangement. Defective data sectors which are discovered during usage are automatically replaced by spare sectors without any requirement for reformatting the storage disk. A one to one interleave of data sectors is achieved for a high efficiency data throughput.

Data Storage Disk 10

A submicro-Winchester rotating storage disk 10, which presently is most preferably 2.5 inches in diameter, but which may be 1.8 inches in diameter, or larger or smaller, is formed of suitably very flat and smooth substrate material such as aluminum metal or glass which is coated with e.g., a magnetic storage medium such as a high oerstead thin film magnetic storage medium vacuum sputter deposited onto the substrate thereby to realize bit densities in the 45,000 plus bits per inch range. The disk 10 defines a central opening 12 to enable a disk clamp 116 securely to clamp the disk 10 to a rotating disk spindle 114, see FIG. 5.

Returning to the disk 10 depicted in FIG. 1, between an inner landing zone area 14 and an outer peripheral zone 16, a data storage area of a multiplicity of concentric data tracks is defined. Because the length of a track at the inner diameter is less than that at the outer diameter, a multiple zone recording methodology is employed to optimize available storage space within the data storage tracks. The tracks are therefore arranged into e.g. eight data zones, 18, 20, 22, 24, 26, 28, 30 and 32, extending from a radially outermost zone 18 to a radially innermost zone 32. A system information region 34 lies radially outwardly just beyond the outer zone 18, and a diagnostics and guard region 36 lies just inside of the inner inner zone 32.

Outermost zone 18 includes e.g. 110 tracks, each having 58 data sectors, with a storage density of 43,334 bits per inch (32,500 flux changes per inch (FCI) encoded in 1,7 run length limited code). The raw data rate is 18.13 megabits per second (MBPS) with a raw code rate of 27.20 Megahertz (MHz). Zone 20 includes e.g. 109 data tracks, each having 56 data sectors per track, with a storage density of 44,269 bits per inch (32,202 FCI), a raw data rate of 17.45 MBPS and a raw code rate of 26.18 MHz. Zone 22 includes e.g. 109 concentric data tracks, each having 52 data sectors per track, a storage density of 42,382 MBPS (31,787 FCI), a raw data rate of 15.69 MBPS and a raw code rate of 23.53 MHz. Zone 24 includes e.g. 109 data tracks, each having 52 sectors per track, with a storage density of 45,334

MBPS (34,008 FCI) and a raw data rate of 15.69 MBPS and a raw code rate of 23.53 MHz. Zone 26 includes e.g. 109 data tracks, each having 47 data sectors per track, a storage density of 45,900 BPI (34,425 FCI), a raw data rate of 14.77 MBPS and a raw code rate of 22.15 MHz. Zone 28 includes e.g. 108 data tracks, each having 44 data sectors, a storage density of 47,008 BPI (35,256 FCI), a raw data rate of 14.00 MBPS and a raw code rate of 21.00 MHz. Zone 30 includes e.g. 108 data tracks each having 41 data sectors, a storage density of 47,294 BPI (35,471 FCI), a raw data rate of 12.98 MBPS and a raw code rate of 19.43 MHz. Innermost data zone 32 includes e.g. 108 concentric data tracks each having 39 sectors per track, a storage density of 48,371 BPI (36,278 FCI), a raw data rate of 12.09 MBPS and a raw code rate of 18.13 MHz. The outer system zone 34 includes e.g. 14 tracks following e.g. the Zone 32 format, and the inner diagnostics zone 36 includes 1 track also following the Zone 32 format. A guard band of four tracks lies immediately inside of the diagnostics zone 36. A track density of, 1700 tracks per inch is realized, and the maximum linear flux density is 36,278 flux reversals per inch.

With this described arrangement of data zones, split data fields and embedded servo sectors, the disk 10 achieves the approximately 42.9 Megabytes rated data storage capacity. A two disk version of the data storage subsystem 5 achieves the approximately 86.3 Megabytes rated data storage capacity.

FIG. 1 also depicts a series of radially extending, evenly spaced apart servo sectors 38. In this particular example, there are preferably 52 of the radial servo sectors 38 (shown diagrammatically as several narrow spokes in FIG. 1) equally spaced around the circumference of the disk 10. With rotation of the spindle 114 and disk 10 maintained at 16.667 milliseconds per revolution (3600 RPM), each servo sector takes up about 24.125 microseconds of each rotational interval. The servo sector pattern is depicted in FIG. 4 and discussed hereinafter. Other drive overhead includes the FIG. 3 data sector ID and data fields. While the number of data sectors in each zone varies, it is apparent from inspection of FIG. 1 that the number of embedded servo sectors in this particular example remains constant, and radially extensive as well as circumferentially equally spaced apart throughout the extent of the storage surface of the disk 10.

As each data sector is of fixed storage capacity or length (e.g. 512 bytes of user data per data sector), and as the density and data rates vary from data zone to data zone, it is intuitively apparent that the servo sectors 38 interrupt and split up at least some of the data sectors or fields, and this is in fact the case in this presently preferred example. The servo sectors 38 are preferably recorded at a single data cell rate and with phase coherency from track to track across the disk 10 with a conventional laser guided servo writing apparatus at the factory. A laser servo writer and head arm fixture suitable for use with the servo writer are described in commonly assigned U.S. Pat. No. 4,920,442, the disclosure of which is hereby incorporated herein by reference.

Figure 2:
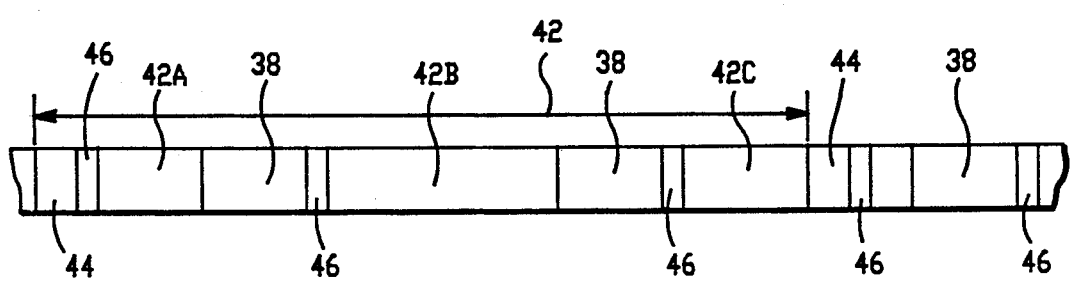
FIG. 2 is a graph of a segment of a data track showing a data field being split into segments by recurrent servo sectors. ID and data headers for the data segments include fault tolerant address marks in accordance with principles of the present invention. While the FIG. 2 graph is a rectilinear depiction, within disk drives, the tracks are typically concentric, and a truer representation would show the FIG. 2 segment as an arc segment of a circular track pattern.

As shown in FIG. 2, a data track 40 includes a data block 42 for storage of a predetermined amount of user data, such as 512 or 1024 bytes of user data, recorded serially by 1,7 RLL code bits in data field areas of the depicted track segment. The data block 42 is interrupted by several servo sectors 38 which contain embedded servo information providing head position information to the disk drive via a data transducer head (not shown) which is positionable radially with respect to the data surface in order to read the data and servo information contained in the track 40, for example, as well as some or all of the other data tracks on the particular surface. The data block 42 includes an ID header 44 at the beginning of the data block and a data header 46 at the resumption of a data field segment following interruption by a servo sector 38, and following each data header 44.

Figure 3:
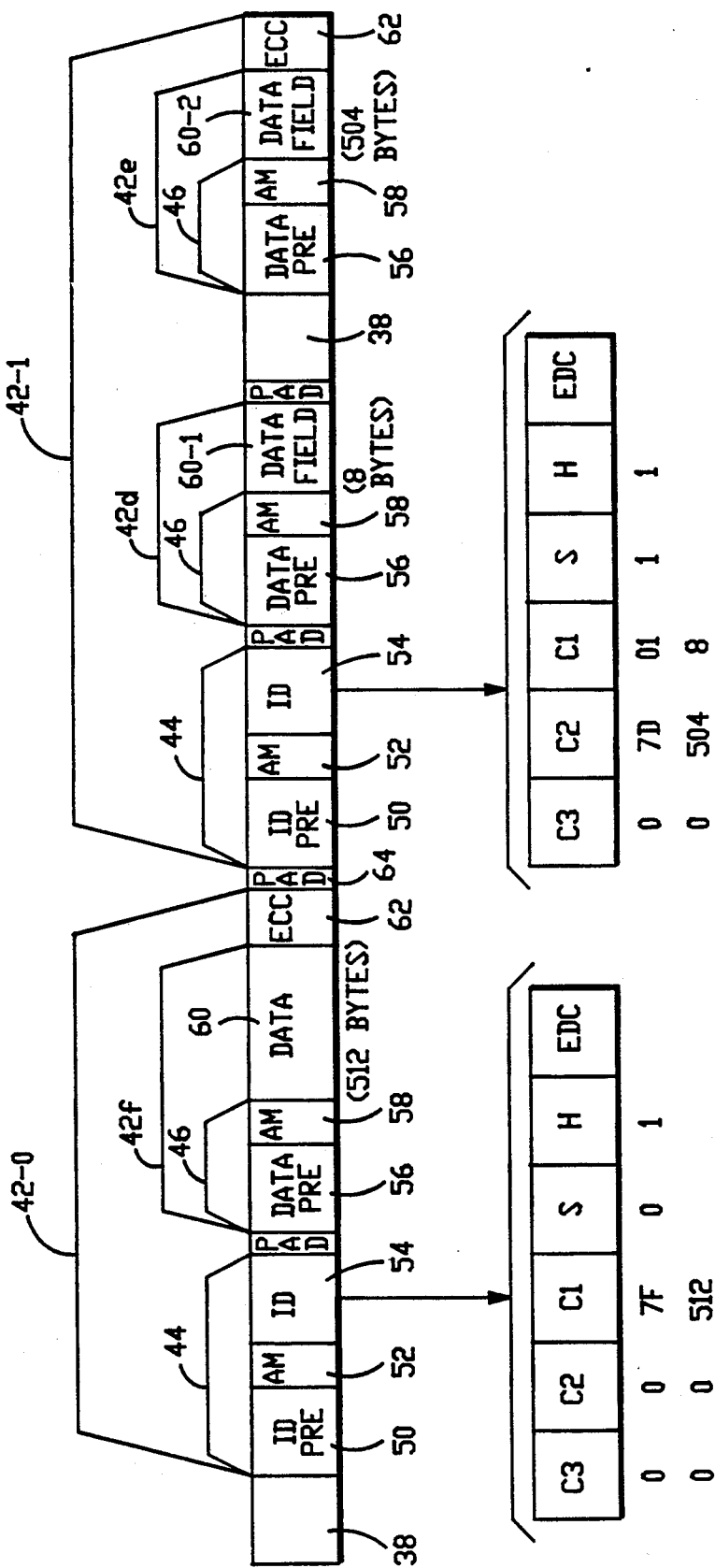
FIG. 3 is a more detailed view of the FIG. 2 data track segment.
Figure 4:
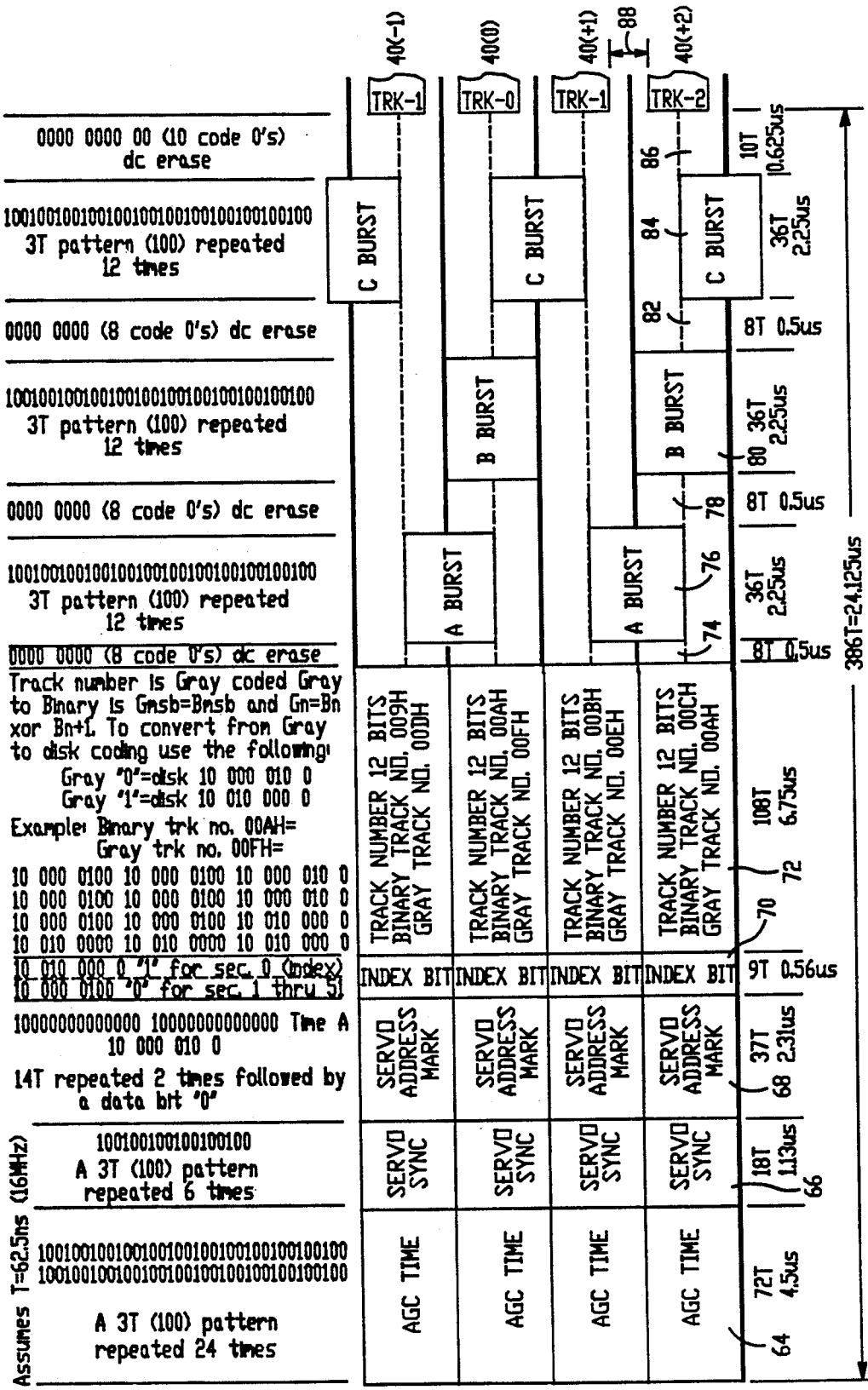
FIG. 4 is a detailed view of one of the plural embedded servo sectors shown in the FIG. 1 plan view.

As shown in greater detail in FIG. 3, the ID header 44 typically may include an ID preamble 50, a data ID address mark 52, an ID field 54 including three or four count bytes, a sector number byte, a head number byte, and a Reed Solomon error detection code. The data ID field 54 is followed by a data preamble field 56, a data address mark 58, and a user data field 60 for storing the predetermined number of user data bytes, such as 512 bytes, for example. The user data field 60 is followed by an ECC field containing e.g. 12 ECC syndrome remainder bytes and two cross-check bytes. A pad field 62 follows the ECC field and separates a first data sector 42-0 from a second sector 42-1, for example.

The first sector 42-0 is shown in FIG. 3 as uninterrupted throughout its circumferential extent. However, the sector 42-1 is interrupted by a servo sector 38 and includes two data segments 42d and 42e, for example. Each split data segment, such as the segments 60-1 and 60-2 shown in the second sector 42-1 of FIG. 3 are preceded by at least a data preamble field 56, and a data address mark 58. Immediately following the last data field segment 60-2 is the error correction field 62 containing the ECC remainder bytes.

The count bytes are used by a data sequencer (FIG. 11) to determine on-the-fly the layout of the particular data sector 42, as to the manner by which it is interrupted by the servo sectors 38. In other words, in the FIG. 3 example the first data sector 42-0 is not split up into segments. Accordingly, count bytes C3, C2 and C1 it, are respectively 0, 0 and 7F(Hex, 127 decimal, the count bytes being divided by 4 to save register room in the sequencer 152). This pattern means that the first segment contains all of the data bytes, and there are no second (C2) or third (C3) segments.

A split data field example is provided with data sector 42-1. Therein, the count bytes C3, C2 and C1 are respectively 0, 70, 01. This pattern of count bytes indicates that the first data segment 60-1 (C1) contains eight user bytes, and the second data segment contains 504 bytes, and that there is no third segment in this particular example.

The count bytes are arranged in reverse order, so that they may be pushed onto a byte count stack 234 within the sequencer 152, as explained in greater detail hereinafter. The last count for the first segment 60-1 (C1), will be the first popped off the stack 234 and loaded into a byte counter 236 of the sequencer 152 as the first segment of the particular data sector 42 is being read from or written to in real time. When the next segment is reached, the next count for the second segment 60-2 (C2) is then popped off of the stack 234 and into the byte counter 236, and when the third segment is reached, the third count (C3) will be popped off of the stack 234 and loaded into the byte counter 236. This activity does not take place for byte count values of zero. In this manner, the data sequencer 152 is able to reassemble the data sectors 42 into unbroken continuous byte sequences which in the case of data reads from the disk are sent into a data block buffer preparatory to being transferred to the host. For incoming data blocks when data is being written to a storage surface of the disk 10, the sequencer 152 uses the count bytes in order to know how many bytes to sequence to the disk surface for each data sector segment.

As already noted, each data sector includes within the ID field several error detection bytes which are used to verify the integrity of the information read back from the particular data ID field. These error detection code bytes (EDC) are preferably Reed Solomon syndrome remainder bytes which are coded from a code compatible with the error detection syndrome remainder bytes contained in the ECC fields 62. The EDC bytes as well as the ECC bytes are checked in real time by an ECC circuit within the sequencer.

A presently preferred on-the-fly EDC/ECC circuit is described in connection with aspects of the present invention in referenced, commonly assigned, copending parent U.S. patent application, Ser. No. 07/650,791, filed on Feb. 1, 1991, the disclosure of which is hereby incorporated by reference.

Pattern for Servo Sector 38

FIG. 4 illustrates graphically the servo pattern for each servo sector 38. The basic cell period (T) for the flux transitions within the servo sector is 62.5 nanoseconds (16 MHz). This constant cell period or rate remains invariant throughout the radial extent of the servo sectors 38, and in this manner differs from the data storage zones 18-32. Each sector occupies e.g. 386 T or 24.125 microseconds.

In this particular example, there are e.g. 12 discrete, phase coherent fields within each servo sector 38. As illustrated in FIG. 2, the sector 38 begins with a 72T AGC field 64 (a 3T pattern 100 repeated 24 times), followed by an 18T servo sync field 66 (a 3T pattern 100 repeated 6 times), followed by a 37T servo address mark field 68 (a 14T pattern repeated two times, followed by a data bit "zero"), followed by a 9T spindle index field 70 (a data bit "one" for the index sector and a data bit "zero" for all other sectors), followed by a 108T track identification field 72 (twelve data bits encoded in Gray code), followed by a first 8T dc erase gap 74, followed by a first 36T A burst field 76 (a 3T pattern 100 repeated 12 times). followed by a second 8T dc erase gap 78, followed by a second 36T B burst field 80 (a 3T pattern 100 repeated 12 times), followed by a third 8T dc erase gap 82, followed by a third 36T C burst field 84 (a 3T pattern repeated 12 times), and finally followed by a fourth 10T dc erase gap 86 which marks the boundary between the servo sector and the start or resumption of the data tracks 40. It will also be noted in FIG. 4 that each data track 40, as recorded, is narrower than the nominal space allotted for each track, leaving a guard band 88 between each track.

In this particular servo sector example, a data bit "one" has a cell format of 10 010 000 0; and, a data bit "zero" has a cell format of 10 000 010 0. In the case of a data bit one, or a data bit zero, there are never more than five zero cells between flux transitions (denoted by 1). The first flux transition of the data bit provides a means for positively synchronizing the asynchronous data reader to the data bit sequence, as will be more particularly pointed out and explained hereinafter. Thus, each servo data bit comprises three cell triads, a first or sync triad (010), a second triad (010 or 000) and a third triad (000 or 010).

In order to realize an effective, reliable and robust digital head positioner servo loop employing servo information within embedded sectors, it is necessary to be able to detect the location of each embedded sector. Detection of each embedded sector 38 requires detection of an unmistakable marker. The marker may be a hard servo sector pulse derived by e.g. a reluctance sensor from a code disk attached to the disk spindle, or in the present example, it most preferably may be a servo address mark decoded from patterns contained within the servo sector 38. A servo address mark will include at least one flux transition pattern which is not going to be mistaken for any legal data pattern in accordance with the selected data code.

In the present example, the design of a unique servo sector address mark is complicated by the presence of data zones, one or more of which may have a pattern which so resembles a servo address mark as to cause confusion within the servo loop. Accordingly, it has been found that two successive 14T patterns, followed by a data zero triad pattern, i,e., 10000000000000 10000000000000 10 000 010 0 provides a very robust and reliable servo address mark. This design takes into account the 1,7 RLL coding employed in the data zones. This coding pattern implies that there may be a legal data pattern of 10000000 (i.e. a flux transition followed by seven zero flux transition intervals at the particular data rate). The actual time period for any legal 1,7 coding pattern employed within any one of the data zones will not equal or exceed the time period of the 14 T pattern within the servo sector. When bit shift tolerance of the present invention is taken into account, in which a 13T pattern will be decoded as a 14T pattern, the maximum time period cannot equal or exceed a 12T (servo frequency) time period. While it is conceivable that noise and other conditions might give rise to the detection of a data field pattern mistakenly thought to be a 14T pattern, the occurrence of such a pattern, followed immediately by another like 14T pattern, followed by a servo data bit zero pattern is most unlikely. Once the servo address mark is found, a servo sector timer is restarted, so that the next servo pattern may be located. The operation of the state machines which decode the 3T 14T and data bit one or zero patterns is discussed in much greater detail hereinafter. While the present patterns for the servo address mark are preferred, other patterns may be employed with very satisfactory results. For example, the first 14T code violating pattern may be followed by a data bit zero pattern which is then followed by a second 14T pattern. Also, the servo address mark patterns (and track identification numbers) may be recorded and/or decoded from patterns in alternating servo sectors, etc. While it is not necessary for each servo pattern to include all of the fields depicted in FIG. 2, a very robust and reliable digital head position servo is realized by employing the information available in all of the fields as depicted.

The A burst, B burst and C burst fields 52, 56 and 60 are used in realizing an edge servo which is more particularly described with aspects of the present invention in the referenced, commonly assigned and copending parent U.S. patent application Ser. No. 07/569,065, filed on Aug. 17, 1990, now U.S. Pat. No. 5,170,299 the disclosure of which is hereby incorporated by reference. The servo data recovery circuit 130 of the present invention is primarily directed to the decoding of the servo address mark and the track number. However, before discussing the servo circuit, an overview of an exemplary disk drive data storage subsystem 100 incorporating the present invention follows.

Head and Disk Assembly 100

Figure 5:
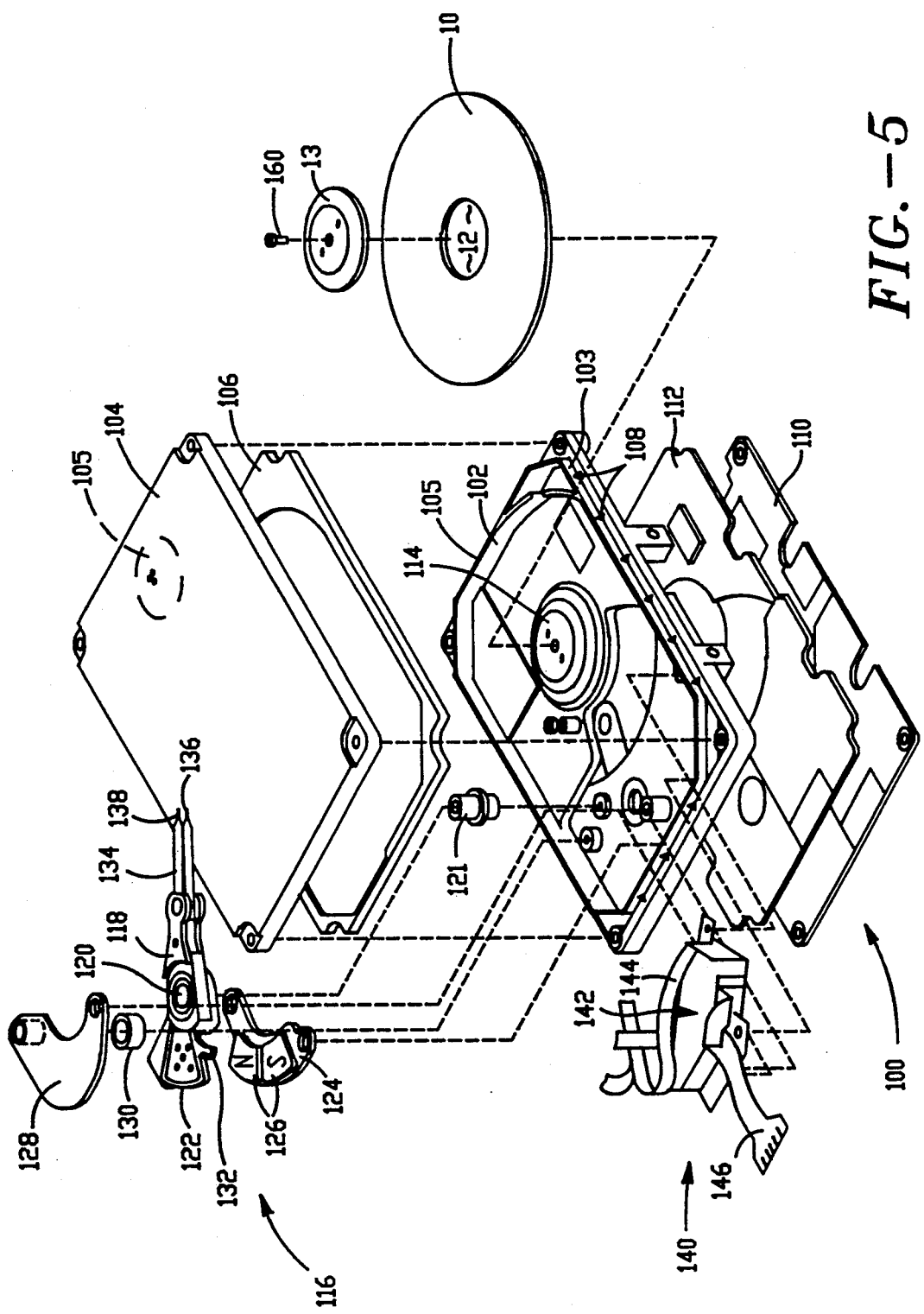
FIG. 5 is an exploded isometric view of a submicro-Winchester head and disk assembly (2.5" disk diameter) incorporating aspects and principles of the present invention.
Figure 6:
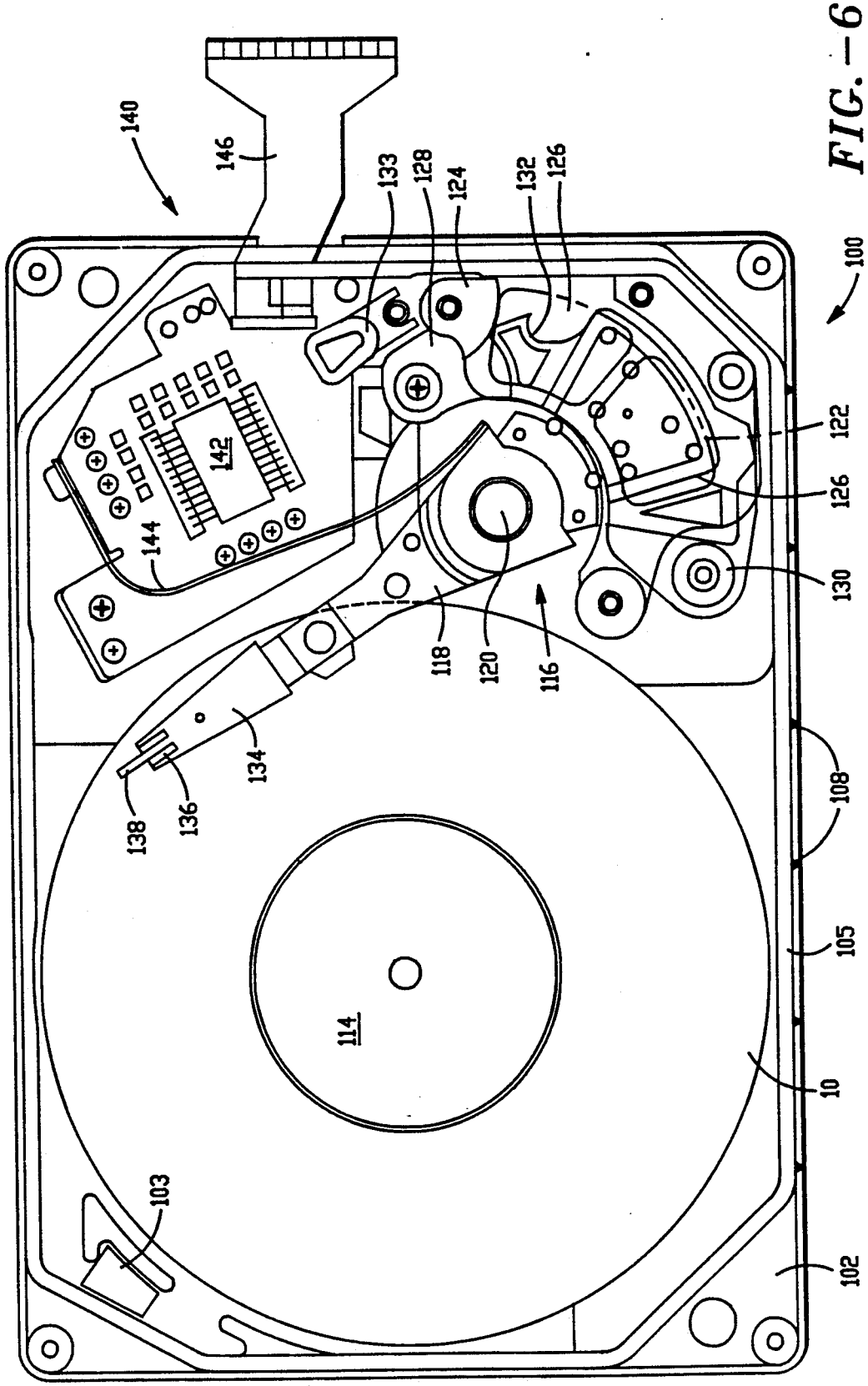
FIG. 6 is a plan view of the FIG. 4 head and disk assembly.

Turning now to FIG. 5, a head and disk assembly 100 of an exemplary fixed disk drive data storage subsystem 5 is depicted in an isometric exploded assembly view. The head and disk assembly 100 includes a base 102 preferably formed as a precision injection casting. The base 102 includes a continuous peripheral sidewall 103 and thereby defines an interior space. A micropore filter 103 filters out any particles from air circulating within the interior space due to rotation of the disk 10. A stamped aluminum cover 104 fits over sidewall 103 of the base casting 102. The cover 104 is securely mounted to the base 102 by four screws: one at each corner. A gasket 106 provides a hermetic seal between the base 102 and the cover 104 and provides a fully enclosed and sealed interior space for the disk 10 and a head actuator assembly 116, as well as for other component parts. A breather filter element 105 mounted on the inside of the cover 104 enables internal air pressure to equalize with the external ambient air pressure.

Knife blade protrusions 108 extend upwardly and outwardly from the peripheral flange 103 of the base casting 102 and bite into the cover 104, when it is clamped onto the base casting 102 and compresses the gasket 106. The protrusions 108 provide positive electrical grounding points between the base 102 and cover 104 and prevent electromagnetic interference or radio frequency interference (EMI/RFI) from reaching the interior space enclosed thereby. Further details of the EMI/RFI suppression preferably employed are set forth in a commonly assigned U.S. patent application Ser. No. 07/674,385 filed on Mar. 25, 1991 by co-inventor Thomas A. Tacklind and entitled "EMI/RFI Reduction for Head And Disk Assembly", the disclosure of which is incorporated herein by reference.

A printed circuit board 110 is mounted to the bottom of the base 102 by screws and carries all of the electronics of the disk drive subsystem 5 (except for a read channel integrated circuit mounted on a plastic film circuit substrate 142 included within the enclosed interior space of the head and disk assembly 100 in order to be closer to the data transducer heads 138 and therefore reduce the electrical noise on the sensitive read channel. The circuit board 110 also includes interface power and signal connectors. A plastic film 112 provides electrical isolation between the circuit board 110 and the bottom of the metal base 102.

A spindle assembly 114 is formed integrally with the base 102 and includes an in-hub DC brushless spindle motor assembly 115. The data storage disk 10 is clamped by the clamp 13 upon the rotating spindle assembly 114. The In-hub spindle motor 115 rotates the spindle assembly 114 relative to the base 102 at a predetermined constant angular velocity, most preferably 3600 rpm.

A mass balanced rotary actuator assembly 116 is included within the interior space defined by the base 102 and the cover 104. The actuator includes a rotary mounting block 118 which is mounted to bearings 120 journalled to a mounting post 121 which is press-fit into a dimensioned cylindrical opening defined by the base 102. A flat, wedge-shaped coil 122 is integrally molded around an extension of the mounting block 118 with a suitable molding compound and may contain a mass-counterbalance in order to counterbalance the actuator assembly 116 and remove e.g. gravitational influences as the drive 5 is positioned in any relative orientation.

A magnet assembly includes a lower flux return plate 124 of suitable ferromagnetic material, such as low carbon steel. Two highly magnetized flat permanent magnets 126 are attached to the lower flux return plate by a suitable adhesive and have magnetic poles extending from major faces, one of the magnets providing a north pole (N) and the other of the magnets providing a south pole (S). The coil 122 is positioned so that one coil leg moves across the north pole face while the other coil leg moves across the south pole face as the actuator 116 moves throughout its limited range of angular displacement. Movements of the actuator are induced by passing direct currents through the winding of the coil 122, and actuator direction is determined by current flow direction. An upper flux return plate 128 completes the magnetic circuit and defines a magnetic gap through which the actuator coil 122 freely passes. Elastomeric bumpers 130 provide inner and outer crash stops for limiting the amount of angular displacement in a manner which does not cause harm to the delicate sliders carrying the thin film or MIG heads 136.

An integral latch arm 132 extends from the molding encasing the coil 122 and engages an actuator latch assembly 133 which is described in commonly assigned, co-pending U.S. patent application Ser. No. 07/696.629 filed on May 7, 1991, and entitled "Bistable Magnetic-/Electromagnetic Latch for Disk File Actuator", now U.S. Pat. No. 5,208,713, the disclosure of which is herein incorporated by reference.

Load beams 134 are mounted to arm extensions of the rotary mounting block 118 and support data transducer heads 136 most preferably formed as thin film elements, or formed as MIG heads, upon sliders which fly in very close proximity to the data storage surfaces of the disk 10, such as at about 4.5 to 5 microinches above the surface of the disk 10. Longitudinally reinforced loading tabs 138 extend from the load beams 134 beyond the heads and sliders 136 and are used to load initially the heads 136 onto the data surface 10 during drive assembly. Further details of the loading tabs are described in commonly assigned, copending U.S. patent application Ser. No. 07/610,306filed on Nov. 6, 1990, and entitled "Data Head Load Beam for Height Compacted, Low Power Fixed Head and Disk Assembly", now U.S. Pat. No. 5,027,241, the disclosure of which is hereby incorporated by reference.

A circuit subassembly 140 is formed upon a flexible plastic film substrate and includes a read channel preamplifier, write driver and head select circuit 142 which leads to a thin flexible plastic film connection cable 144 which attaches to the rotary mounting member 118 of the rotary actuator 116 in order to supply the electrical driving currents to the coil 122 and to provide signal connections to the heads 136. Another cable 146 ends in a thin film plug which is engaged by a connector mounted on the circuit board 110. The flat plastic film cable 146 passes between the base 102 and the cover 104 to enable electrical connections from the subassembly 140 to pass through to the outside and connect to the circuit board 110.

As shown in FIG. 7A, the integral disk spindle and motor 114 includes a cylindrical portion 150 of the base 102. Two bearings 152 and 154 are secured within the cylindrical portion 150 by a suitable adhesive. A rotating central shaft 156 is press-fit into a cup-shaped flange 158 which aligns and supports the disk 10. The disk clamp 13 is clamped over the flange 158 and bears down on the disk 10 by virtue of a central screw 160 (FIG. 5). Returning to FIG. 7A, the flange 158 includes an outer annular extension 162 which is located beyond the central opening of the disk 12. Affixed to this annular extension 162 is an annular flux return plate 164; and, attached on the inside to the flux return plate 164 is a segmented permanent magnet 166. The segmented permanent magnet has alternating polar faces which adjacently face poles formed by stacked stator plates 168. Driving coils 170 are wound around the stator plates 168. A three phase arrangement is presently preferred. Suitably phased driving currents passing through the coils 168 cause the magnet 166 to rotate, and with it the flange 158 forming the disk spindle 114. By forming the spindle 114 and DC brushless motor integrally with the base 102, a number of improvements are realized. The spindle is always aligned, and it does not shift its position relative to the actuator position over repeated thermal cycling as was the case frequently with separately attached direct drive spindle motors of the prior art. Vertical offset is also likewise minimized. The base 102 may be strengthened at the vicinity of the spindle 114 and result in less susceptibility to vibrations in use.

A slightly enlarged head and disk assembly 100A is depicted in FIG. 7B. This assembly 100A encloses two data storage disks 10A and 10B and four data transducer heads 136 which are positioned commonly by the rotary actuator 116. Arm extensions 118A, 118B and 118C of the rotary member 118 secure and align the four load beams associated with the four heads. The rotary flange 158A is slightly enlarged in the height dimension in order to accomodate the disks 10A and 10B, and a spacer ring 174 is placed between the two disks and a top clamp 13A, which is secured to the flange 158A by plural screws 160. In addition, magnets 126 are also secured to the upper flux return plate 128 in order to provide additional magnetic flux for the actuator coil necessitated by the greater mass of the actuator.

The overall height of the assembly 100A is about 0.75 inch, which is slightly greater than the overall height of the single disk assembly 100 (0.61 inch). Other than these differences, the head and disk assembly 100A is substantially the same as the assembly 100. (The flux return plates 124 and 128, and the magnets 126 of the rotary actuator 116 are not shown in FIG. 7B.) The width of both assembilies 100, 100A is approximately 2.76 inches, and the depth is approximately 4.00 inches.

One or more Hall effect sensors 172 may be placed adjacent to the spindle magnet 166 in order to determine relative position of the magnetic poles thereof relative to the fixed poles of the stator 168 in order to provide feedback control for commutation of the motor, particularly to prevent reverse rotation of the spindle motor at startup. A motor driver circuit (FIG. 8), such as a type HA134915 spindle motor driver, manufactured by Hitachi, may be employed in conjunction with the Hall effect sensors 172 to provide appropriately commutated driving currents to the three phase coils 170 of the spindle motor for use within a single disk drive embodiment. A spindle motor for a dual disk drive embodiment is also preferably driven by the type HA134915 spindle motor driver, manufactured by Hitachi and connected in a configuration to provide greater power output to the spindle motor.

A type ULN8901LBW driver made by Sprague, or equivalent, may be used if the Hall sensors 172 are not used to commutate the three-phase windings of the brushless DC spindle motor.

A plurality of e.g. thin film data transducer heads 136 are respectively associated with opposite major data storage surfaces of the data storage disk 10, or disks 10A and 10B. The data transducer heads 136 are preferably mounted to the in-line aligned reversed flange load beams 134. The thin film heads 136 are formed on ferrite sliders which operate conventionally in a contact-start-stop relationship with respect to the data surface, and they "fly" above and very close (e.g. within about 5 microinches) to the surface during operations upon an air bearing formed by disk rotation and airflow. Alternatively, and particularly when the disks 10 are formed of a glass substrate, the heads and sliders 136 may be dynamically loaded onto and unloaded from the data storage disk in accordance with the teachings of the referenced and commonly assigned U.S. patent application Ser. No. 07/610,306, now U.S. Pat. No. 5,127,241.

@Magnetic flux transitions comprising both user data and servo sector data 38, are written by or read by the selected head 136 during data write or read operations. The data read by the head 114 is passed through the preamplifier circuit 142 (FIG. 5) which also provides head selection and write driving functions during data write operations. A conventionally available integrated circuit, such as the SSI 32R4610 four channel thin film head read/write device made by Silicon Systems, Inc., Tustin, Calif., or equivalent, is presently preferred for implementation of the circuit 142. The circuit 142 enables four separate heads 136 to be individually selected. As already noted, the integrated circuit 142 is preferably mounted within a space defined within the head and disk assembly 100 upon a thin plastic film (Mylar) flex circuit substrate which carries conduction traces leading to connections at the external printed circuit board 110 carrying the other circuit elements of the disk drive 5. The circuit 142 is placed as close to the heads 136 as possible in order to reduce connection lead length, and to improve signal to noise ratios for each of the heads 136.

Electrical Block Diagram of Drive Subsystem 5

Turning now to the system block diagram provided in FIG. 8, the generally vertical dashed line represents a dividing line between the electromechanical head and disk assembly 100 and the printed circuit board 110 which carries all of the electronic circuit elements shown in FIG. 8 other than the preamplifier 142. Interconnections between the HDA 100 and board 110 are by way of thin film flex circuit conductor plugs and thin film receptor connectors mounted on the circuit board 110. One connector serves the rotary actuator 116 and preamplifier circuit 142, while another connector serves the spindle motor 114, for example.

The drive subsystem 5 has one read/write data transducer head 136 for each data surface. The signal path for the read channel begins at the selected read/write head 136. As the magnetic flux transitions recorded in a particular track pass under a corresponding head, low-amplitude differential output currents are induced in the head. These signals are amplified in the read channel preamplifier 142 and are then transmitted onto the main circuit board 110 via the flex circuit.

The circuit board 110 contains nine major electrical elements, together with a number of related discrete components, such as transistors, diodes resistors, capacitors, connectors, etc. The major electrical elements include a pulse detector ASIC 200, a data sequencer and control ASIC 202, an interface ASIC 204, a single SRAM of either e.g. 8 kilobytes or 32 kilobytes capacity functioning as a cache buffer random access memory 206, a master microcontroller 208 having an on-board multiplexed analog to digital converter 209 and being controlled by a control program contained in time-critical part within an internal program memory and contained in balance in an external program memory 210, an actuator low pass filter 212, an actuator driver 214, and a spindle motor driver 216.

The pulse detector ASIC 200 further amplifies, filters and processes the read signal in order to reduce ambiguities, such as drop-ins and drop-outs; and then converts the signal from the serial encoded data to a synchronized data stream with its accompanying data clock. In order to perform these functions, the ASIC 200 includes a pulse detector section 220 which converts the analog flux transitions into data pulses having transitional edges. Gain of the pulse detector circuit 220 is controlled by an AGC control circuit 222 which is also contained within the circuit 220. The pulse detector circuit 220 decodes the analog flux transitions into shaped digital edges or pulses representative of raw (unsynchronized) encoded data.

The circuit 200 also includes a write pre compensation circuit 224 for precompensating data to be written to the disk 10 during data writing operations, and a plurality of peak detector circuits 226 for detecting peak amplitudes of the A and B or C servo bursts contained within the servo sectors 38 during track settling operations at the end of track seeking operations, and during track following or "on-track" operations. The three bursts A, B and C occur within each servo sector 38. During on-track operations the A and C bursts will be at half amplitude; and for even tracks the B bursts will be at full amplitude, while for odd tracks the B bursts will be at minimum amplitude. The A and B bursts are used during settle mode at the end of a track seeking operation.

The circuit 200 also includes a phase locked loop (PLL) 228 for locking onto incoming data at a data rate predetermined for the particular data zone, as previously explained. A data frequency synthesizer 230 is provided within the circuit 200 for selectively generating the data transfer rate applicable within each track zone and supplying the synthesized frequency to the PLL 134. Frequency selection is under the control of the master controller 208. The circuit 200 is preferably implemented as a single +5 volt low power VLSI package, such as a type DP8491 made by National Semiconductor Corporation, or equivalent.

Data Sequencer and Control Circuit 202

The data sequencer and control circuit 202 is also a single low power VLSI package operating on a +5 V power supply, and it includes a servo data timer and decoder circuit 232. The circuit 202 also includes a pulse width modulator 234 for sending strings of controlled duty cycle pulses generated from values supplied from the microcontroller 208 through the servo low pass filter 212 to the servo driver circuit 214. In response to the incoming control values from the low pass filter 212, the servo driver circuit 214 generates and applies bidirectional drive currents to the coil 122 of the rotary actuator 116. Essentially, a digital servo is realized, as described in the referenced commonly assigned U.S. Pat. No. 4,669,004. However, there are improvements over that disclosure which are described in the referenced copending parent U.S. patent application Ser. No. 07/ 569,065 filed on Aug. 17, 1990, entitled "Edge Servo For Disk Drive Head Positioner", now U.S. Pat. No. 5,170,299, and commonly assigned, copending U.S. patent application Ser. No. 07/710,172, filed on Jun. 4, 1991 and entitled "Servo Data Recovery Circuit for Disk Drive Having Digital Embedded Sector Servo" the respective disclosures of which are hereby incorporated by reference.

The circuit 202 also includes an encoder/decoder 236 which decodes incoming data from e.g. 1,7 RLL code to NRZ format, and encodes data from the host in NRZ format into e.g. 1,7 RLL code. The encoder/decoder 236 is substantially as described in a commonly assigned U.S. Pat. No. 4,675,652, the disclosure of which is hereby incorporated by reference. In actuality, while the encoder/decoder 236 is shown as a separate structural element, it is actually a part of a data sequencer 238. The data sequencer is described hereinafter in greater detail in conjunction with FIG. 11. It basically functions to sequence serial by bit coded data to and from the storage disk 10 and serial by byte unencoded data to and from the cache buffer memory 206 as controlled by a buffer memory controller 240 which is also included within the circuit 202.

The circuit 202 further includes a spindle motor speed regulation circuit 242 which monitors disk rotational speed by any suitable method, such as feedback from the motor driver circuit 216. Disk rotational speed may be determined by comparing actual disk rotation time with a crystal reference. Speed up or slow down signals are sent by the motor control circuit 242 to the motor driver 216. The master control circuit 202 also includes a microprocessor interface 244 which connects directly to an internal control bus structure over which control data and control address values are sent to and from the programmed digital microcontroller 208.

Finally, the circuit 202 includes a master clock 246 which generates all of the clocking signals for the drive subsystem 5 and supplies them e.g. to the microcontroller 208, the pulse detector circuit 200, the interface circuit 204 and throughout the other circuits contained within the master control circuit 202.

Bus Structures

A microcontroller multiplexed address-data bus 241 extends between the microcontroller interface circuit 244 of the master control ASIC 202, the interface circuit 204 and the microcontroller 208. Address lines 243 from the microcontroller 208 pass into the microcontroller interface circuit 244 wherein latches hold certain bit positions (A15-A13, A7-A0) of the address values and supply them to the external program memory 210 over an address bus 245. Other address bit position values (A12-A8) are supplied directly from a port of the microcontroller 208 to the external program memory over an address bus 210. A buffer data bus 248 interconnects the buffer controller 240, the buffer memory 206 and the interface control ASIC 204. Buffer memory addresses generated by the buffer controller 240 are supplied to control addressing of the buffer memory 206 over a buffer address bus 249. A control bus 250 extends between the interface circuit 204 and the memory controller 240 to synchronize and facilitate data transfers between the interface 204 and the buffer memory 206. A SCSI or AT interface bus 251 extends from the interface control ASIC 204 to a host computing system or other appliance with which the storage subsystem 5 is operatively connected for data storage and retrieval. Host commands and user data blocks to be written to disk 10 are received from, and subsystem status and user data blocks retrieved from the disk 10 are sent to, the host system. A bus terminator 253 may be included to provide impedance matching for the data and control lines of the external bus 251.

Figure 9:
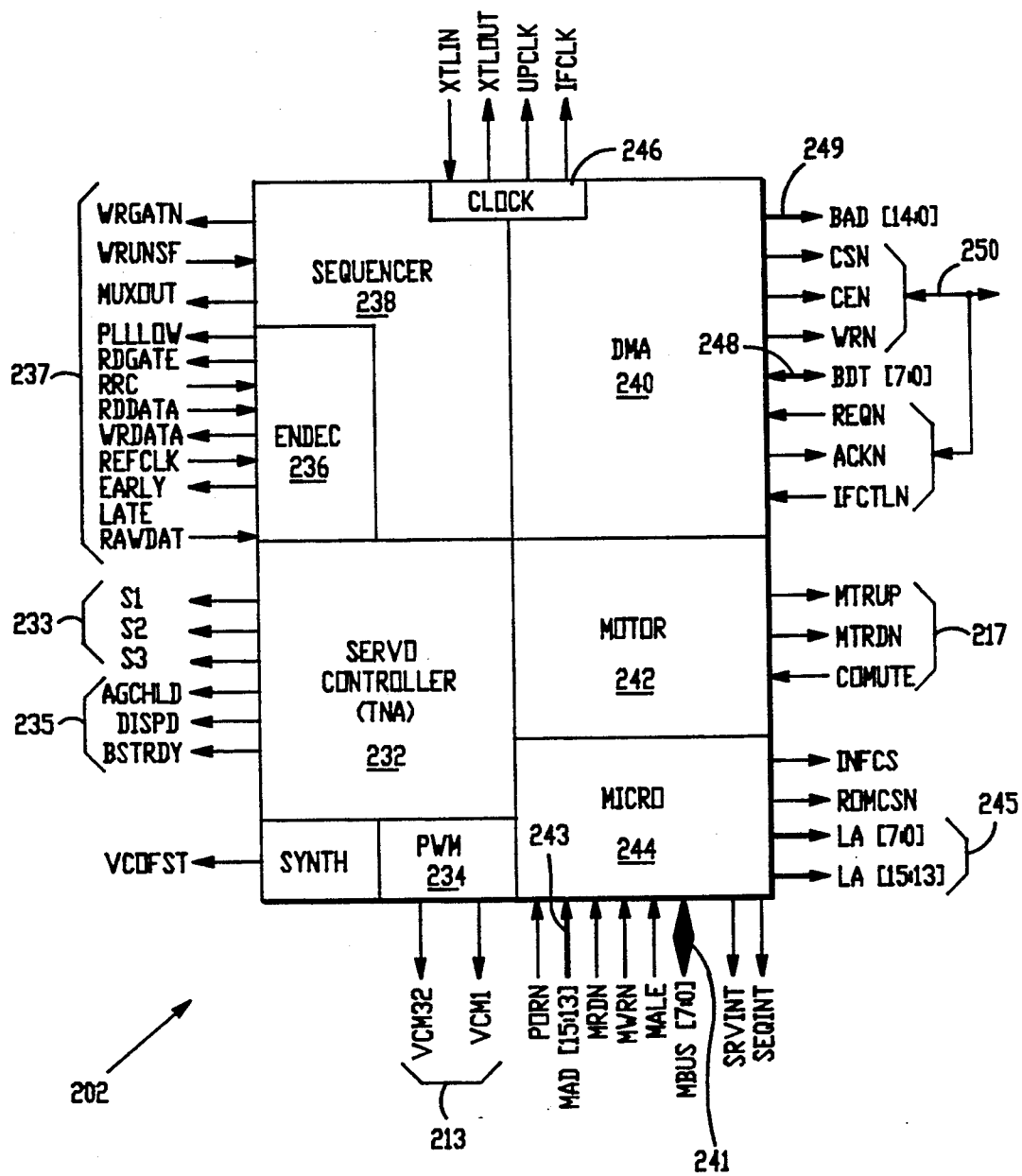
FIG. 9 is a more detailed block diagram of an integrated circuit combining a number of functional elements of the FIG. 7 system (Buffalo).

FIG. 9 illustrates in greater detail the various lines and buses which lead to and from the functional circuits and elements included within the master control circuit 202. Two output lines 213 extend from the PWM 134 to the servo low pass filter 212. Motor control lines 217 extend between the spindle motor driver 216 and the spindle speed monitor circuit 242. Gate control lines from the servo controller 232 extend to the peak detectors 226 of the circuit 200. AGC control lines 235 extend to the AGC circuit 222 of the same ASIC 200. A number of lines collectively identified by the reference numeral 237 extend between the encoder/decoder 236 and sequencer 238, and the circuits 142 and 200.

Figure 10:
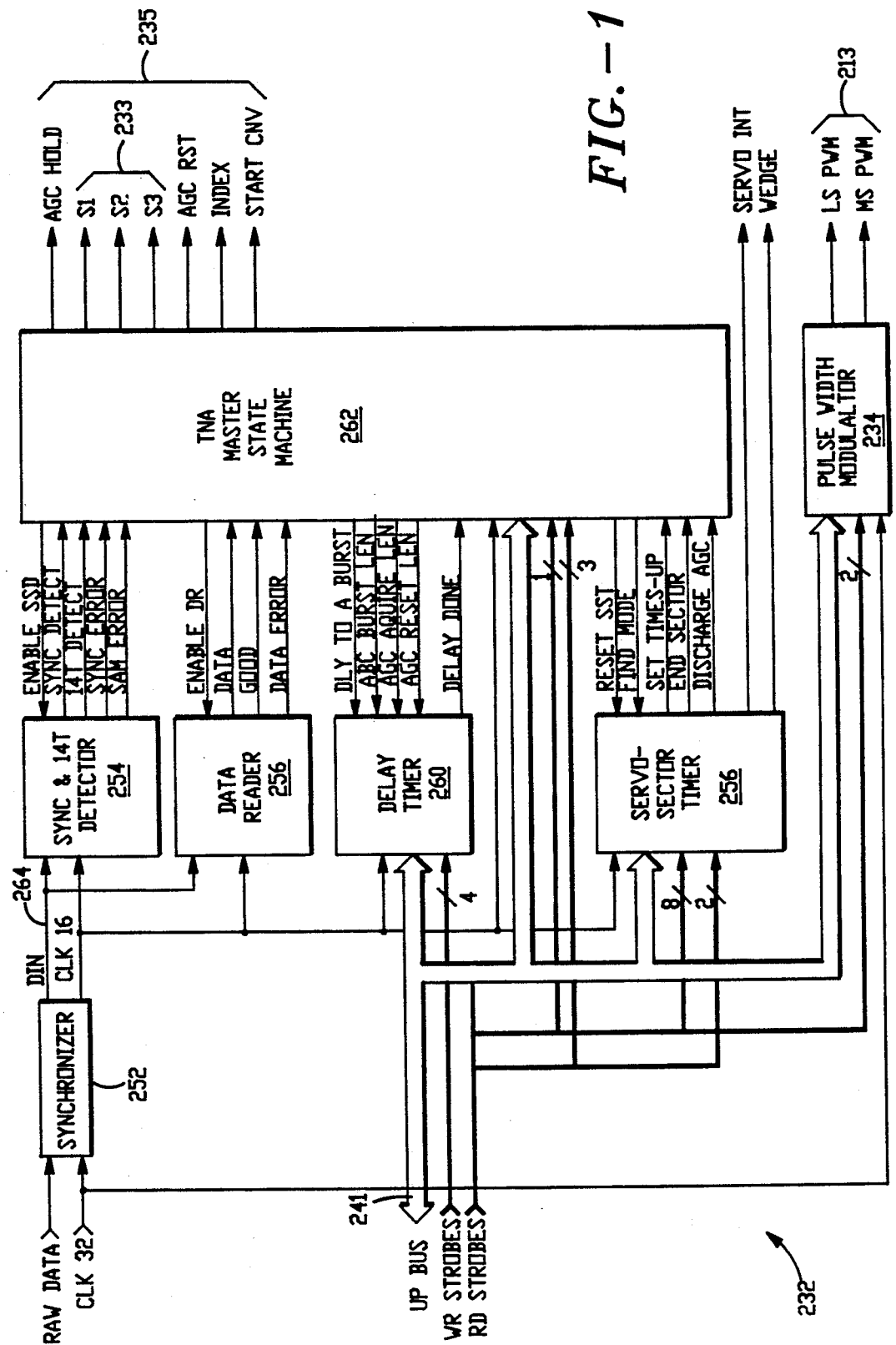
FIG. 10 is a more detailed block diagram of a servo timer and decoder subsystem included within the FIG. 8 integrated circuit.

Servo Timer and Decoder 232 (FIG. 10)

The servo data decoder circuit 232 includes a synchronizer 252 for synchronizing incoming raw data from the pulse detector 220 to an internal clock, a sync and unique pattern detector slave state machine 254 for detecting servo sync and a unique pattern within a servo address mark field, a data reader slave state machine 256 for decoding data bits included within the servo address mark field 68 in index bit field 70 and a Gray coded data field 72 indicating the particular surface and track number. The servo timer and decoder circuit 232 also includes a sector timer 258 which generates and puts out expected servo sector times within the circuit 232 based upon detection of each servo address mark, and a delay timer 260 for timing delay periods associated with centerline burst fields included within each servo sector 38, and for putting out delay gates, the gates being used to control operation of corresponding ones of the peak detectors 226.

Functional operations within the servo decoder circuit 232 are managed and supervised by a servo master state machine 262 which monitors the slave state machines 254 and 256 and thereby determines detection within a particular servo sector 38 of the servo address mark, an index mark, and collects the bits comprising the Gray coded track identification number. This track identification number is then passed to the microcontroller 208 which decodes it and determines head position during track seeking and settling operations of the drive.

FIG. 10 sets forth a more detailed block diagram of the servo data recovery circuit 232, including the particular control and data lines passing between the raw data synchronizer 252, sync and 14T detector 254, data reader master state machine 262, delay timer 260, sector time 258, and pulse width modulators 234.

The raw data synchronizer 252 comprises four D type flip-flops 180, 182, 184, and 186, and a two-input exclusive OR gate 188 configured so as to eliminate any metastable states resulting from the incoming unsynchronized raw data. The data synchronizer 252 functions to frame incoming raw data on the servo data path from the pulse detector 220 with e.g. positive duty cycles of a master clock signal occurring at 16 MHz. The 16 MHz master clock signal is put out by the master clock 246. It will be remembered that the basic clock frequency for the period T of the FIG. 4 servo sector data is 16 MHz, however spindle rotational tolerances and jitter for example may cause slight variations in the incoming raw data rate, and its phase will not normally be aligned with the phase of the reference clock signal.

In order to synchronize the raw data pulses from the pulse detector 220 to the 16 MHz signal from the master clock 246, the flip flops 180, 182, 184 and 186 are clocked on rising edges of the clocking signal. By the time that the incoming raw data pulses propagate through the logic network comprising the synchronizer 252, they have been offset in time so as to occur with the next rising edge of the 16 MHz reference clock.

The output from the raw data synchronizer 252 is a data input (DIN) signal which is passed via a line 264 to the sync and 14T detector 254 and the data reader 256.

The master state machine 262 causes the servo sector fields 40, 42, 44, 46, 48, and 50 in each servo sector 38 to be processed, and provides delay timing for edge servo processing of the burst fields 52, 56, and 60, as separated by the interfield gaps 50, 54, 58 and 62. The master state machine 262 receives timing input signals from the delay timer 260 and from the sector timer 256, and it receives data inputs from the sync and 14T detector 254 and from the data reader 256. The master state machine 262 has two main modes of operation: a normal mode, and a find-mode. The find-mode is invoked when the disk drive subsystem 5 is initialized and the servo timer and decoder 232 first synchronizes in real time with the servo information within each servo sector 38. The supervisory microcontroller 208 enables the servo circuit 232 asynchronously relative to servo sector timing.

In find-mode, the servo circuit 232 loops to look for another servo address mark pattern immediately following signalling by the master state machine 262 of any servo address mark error condition. In normal mode, when a servo address mark error condition occurs, the servo circuit 232 continues to process the current servo sample and marks time until the next expected occurrence of a servo sample as the disk rotates beneath the selected data head, as timed by the servo sector timer 256.

The sync and 14T pattern detector 254 performs two discrete functions: sync detect, and 14T pattern detect. In performing the sync detect function, the detector 254 monitors incoming data from the synchronizer 252 on the synchronized data input line DIN 264 in order to detect a 3T pattern. It is important to note that the AGC field 40 and the servo sync field 42 comprise two contiguous, identical patterns nominally of 3T. Because of spindle motor variations and tolerances within the disk drive subsystem, the delineation between the AGC field 40 and the servo sync field 42 is subject to timing variations, perhaps as much as 500 nanoseconds (plus or minus 8T). Accordingly, the sync and 14T detector is enabled during the transition from a second state MS2 of the master state machine 262 to a third state MS3 of the master state machine 262. Thereafter, whenever three consecutive 3T patterns, plus or minus one T pattern, are detected, the logical condition SYNC DETECT is put out by the sync and 14T detector 254, and the master state machine 262 progresses from a master state MS3 to the next master state MS4 at which time the search begins for the 14T pattern.

After the sync pattern has been detected and the master state machine has advanced to its state MS4, the detector 254 functions as a 14T detector, meaning that after detecting a first flux transition, or "one", it looks for an unbroken string of either 12, 13 or 14 T periods of no flux transition or "zeros". Nominally, the pattern is 13T without flux transitions. However, since the detector 254 is operating asynchronously with incoming data (no phase locked loop), a plus or minus one T tolerance is advantageously provided to accommodate resultant single bit shift asynchronicity.

As noted above, the data reader 256 operates to recover the data values contained within the Gray coded track number field 48 (FIG. 4). The servo data bit pattern for a zero binary data bit value is 10:000:010:0; and, the servo data bit pattern for a one binary data bit value is 10:010:000:0.

It is important to note that the first occurring flux transition will be at approximately the same location in time and is of the same polarity or sense for each of the three data pattern conditions comprising each track number binary data bit value. This first or sync transition enables the data reader 256 to recover the servo sector data bits comprising end of sector address mark, index bit, and the multi-bit track number in a very reliable fashion. This method, while requiring nine clock periods (three triplets) per track number binary data bit, has proven far more reliable than prior art schemes which used e.g. six clock periods without the sync bit. Triplets are used to obtain reliable data recovery with flux transitions occurring plus or minus one clock cycle. This approach obviates the requirement that a phase locked loop be employed for servo data recovery, particularly in the preferred disk drive subsystem 5 having data zones and split data fields. The asynchronous clocking of the data reader 256 enables the servo reliably to recover the data track Gray coded number within an error range of only plus or minus one physical track location.

The servo system has three basic modes of operation: a velocity mode during track seeking; a settle mode at the end of a seek; and, a track following mode. The acceleration and deceleration of the actuator for seek lengths of two or more tracks are carried out within the velocity loop. A velocity profile is stored in the program memory and is used as a lookup table by the microcontroller 208. The bandwidth of the velocity servo loop is kept low, and feed forward is heavily used. The settle mode is used for all accesses including head switches, single track seeks and multiple track seeks. Th settle mode is a position loop with velocity damping. No feed forward is employed in the settle mode. The track following mode is used when the selected data transducer 136 is following the centerline of the desired data track. Track following mode is also a position based servo loop and includes an integrator in the loop compensation path.

A more comprehensive description of the servo timer and decoder 232 is given in the referenced and copending U.S. patent application Ser. No. 07/710,172, entitled "Servo Data Recovery Circuit for Disk Drive Having Digital Embedded Sector Servo", to which the interested reader is specifically referred.

Figure 11A:
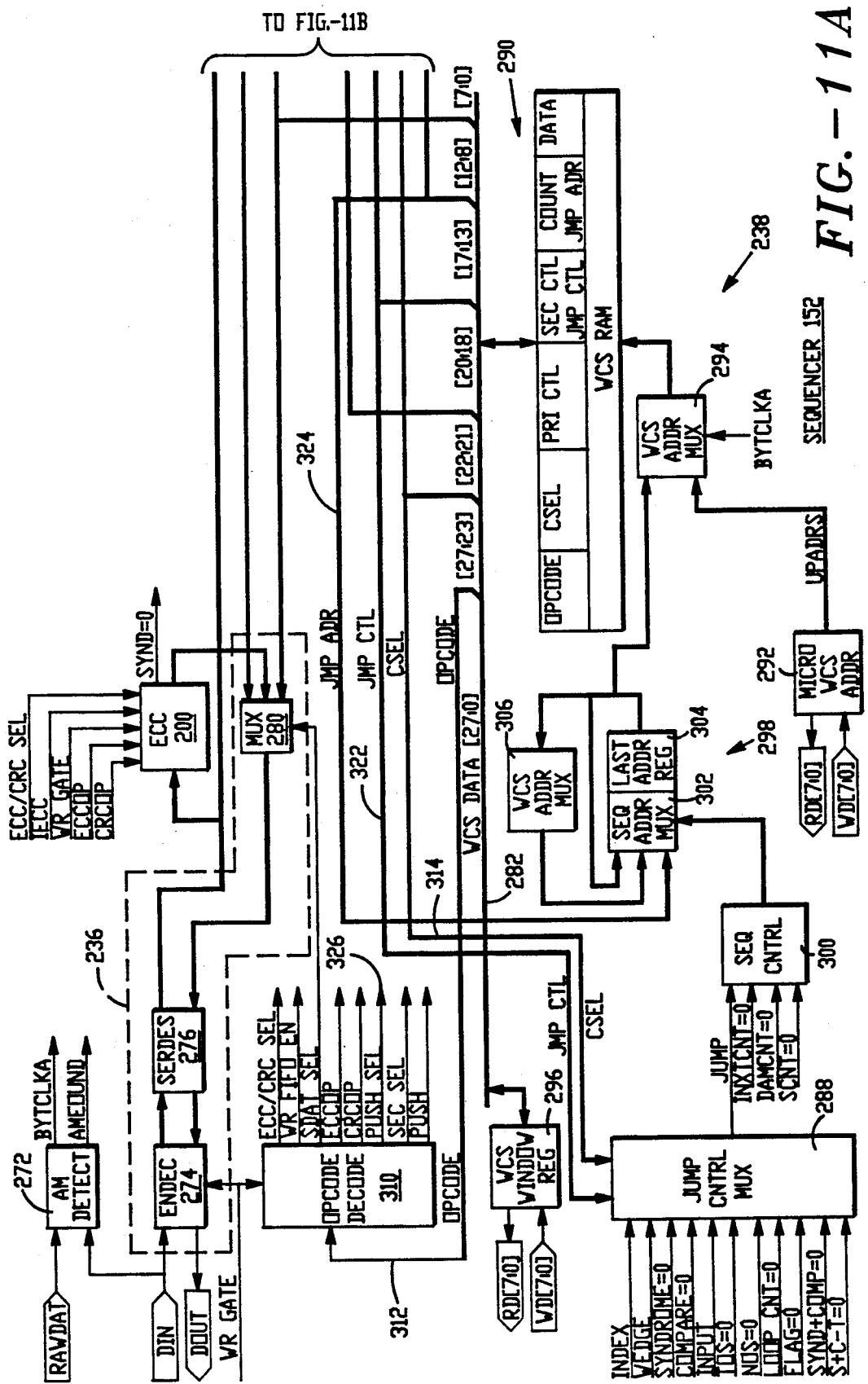
FIGS. 11A and 11B together provide a more detailed diagram of a data sequencer subsystem included within the FIG. 8 circuit.
Figure 11B:
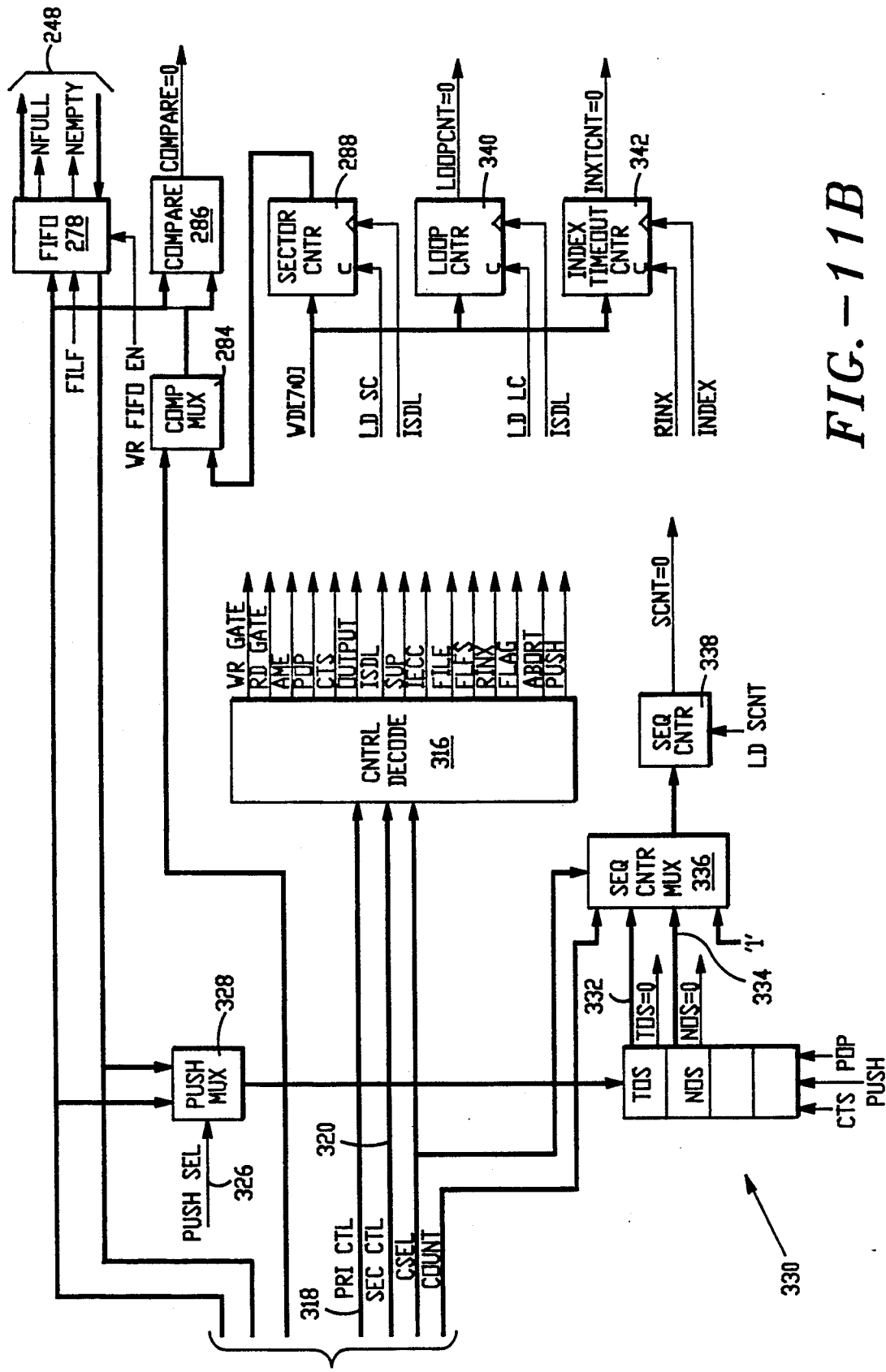

Data Sequencer 238 (FIGS. 11A and 11B)

Turning now to FIG. 11, architectural details of the data sequencer 238 are given in greater structural detail. The data sequencer 238 includes an on-the-fly error correction circuit 270 as described in the referenced parent U.S. patent application Ser. No. 07/650,791. The data sequencer 238 also includes a data field address mark detector 272 which receives incoming digitized raw data directly from the pulse detector circuit 220. The address mark detector 272 looks for a sequence high frequency flux transitions, and when such is detected, the PLL 228 is then locked onto the sequence. The address mark detector 272 includes a data synchronizer of the same type as the servo synchronizer 252 for synchronizing the incoming raw data with a read data clock. The recovered synchronized digital run length encoded data is then checked for the presence of the address mark sequence.

In this regard, the address mark detector 272 monitors the data stream in order to detect a unique bit sequence which is not consistent with the 1,7 encoding rules and which is predetermined to represent an address mark. The address mark detector 272, described in greater detail in a commonly assigned and contemporaneously filed U.S. patent application Ser. No. 07/710,065, filed on Jun. 4, 1991 and entitled "Fault Tolerant RLL Data Sector Address Mark Decoder"; the disclosure being incorporated by reference herein, generates the byte clock signal BYTCLKA from the raw data stream as well as an address mark found control signal whenever a bit sequence representing an address mark is found in the raw data stream.

The endec 236 actually includes a 1,7 run length limited encoder/decoder 274 which encodes and decodes serial data into and from a 1,7 run length limited (RLL) code, and a serializer-deserializer (SERDES) 276 which serializes and deserializes three bit code groups relative to data bytes. A FIFO byte register 278 enables data bytes to be asynchronously transferred between the sequencer 238 and the external cache buffer memory array 206, clocked by an external crystal clock standard supplied by the master clock 246 (as opposed to the BYTCLKA which is synchronized with the raw data stream read back from the disk). A multiplexer 280 also included within the endec 236 regulates bidirectional data flow through the serializer/deserializer 276 and encoder/decoder 274 so that ECC syndrome bytes generated by the ECC generator 270 may be appended to data blocks flowing to the storage surface of the disk 10, and so that data values present on a writeable control store (WCS) bus 282 may also be sent to the disk 10 for storage, or retrieved from the disk.

Reference data sector (i.e. physical sector and transducer head) identification bytes read from data ID fields are passed through a comparison multiplexer 284 to a comparison circuit 286. The comparison circuit 286 compares actual data sector identification bytes received from the SERDES 276 with the reference identification bytes held in a sector counter 288. If a correspondence exists, the desired sector location has been reached, and a Compare=0 control signal is put out by the comparison circuit 286 to a jump control multiplexer circuit 288.

A writeable control store (WCS) 290 stores program control sequences which determine and control all of the operational states of the sequencer 152. The WCS 290 may be loaded and read directly by the microcontroller 208 at locations thereof controlled by addresses decoded by a microcontroller address latch 292. During one half of the BYTCLKA clock cycle, a multiplexer 294 enables direct access by the microcontroller 208 to the WCS 210 via a data latch 296.

During the other half of the BYTCLKA cycle, addresses from a sequence controller 298 are used to address the control store 290. The sequence controller 298 includes a sequence control decoder block 300 which enables the controller 298 to jump to a plurality of predetermined states, a sequence address multiplexer 302 which selects between various addresses, a last address register 304 for holding the last sequencer address for application to the control store 290 via the multiplexer 294, and a writeable control store address incrementer 306 which selectively feeds back the next address above the last address held in the register 304 to the sequence address multiplexer 302.

The sequence controller 298 is directly controlled by the jump control multiplexer 288 which generates a jump control signal from a plurality of logical inputs as indicated in FIG. 11. The 28 bit wide writeable control store (WCS) data bus 282 directly communicates with an internal random access memory of the WCS 290 and enables the values held therein to circulate throughout the sequencer 238 along the paths shown in FIG. 11.

Each 28 bit control word or sequence for the WCS 290 comprises an opcode field, a count select field, a primary control field, two dual function fields (secondary control/jump control and count data/jump address) whose functions are determined by the count select field values, and a data field. The WCS 290 separates the opcode values and sends them to an opcode decoder 310 via an opcode bus 312. The count select values are separated by the WCS and sent via a count select bus to control operations of the jump control multiplexer 288 and operations of a control field decoder 316. The decoded primary control values are sent via a primary control bus 318 to the control decoder 316, and decoded secondary values are sent via a secondary control bus 320 also to the control decoder 316. Decoded jump control values are applied directly via a jump control bus 322 to control the jump control multiplexer 288, while decoded jump address values are sent via a bus 324 directly to the sequence address multiplexer 302 so as to control jump addressing within the WCS 290.

A PUSH SEL control decoded by the opcode decoder 310 extends via a line 326 to a push multiplexer 328 which enables e.g. data field count bytes C3, C2 and C1 from a data header presently being read by a selected head 136 to be pushed directly onto the top of a four byte register stack 330. A top of stack (TOS) bus 332 and a next of stack (NOS) bus 334 directly connect the stack 330 to a byte sequence counter multiplexer 336 which programmably selects between inputs leading to a byte sequence counter 338. The multiplexer 336 also possesses the ability to load the byte sequence counter 338 with "1" values.

The byte sequence counter 338 is preset with a particular count byte representing the number of bytes to be transferred during a user data segment, such as the segment 60-1 shown in FIG. 3. The byte sequence counter 338 also maintains a present byte count for a present particular state of the sequencer 238. When the presently loaded byte count increments to zero, the end of a particular sequencer state is reached, and the sequence counter 338 puts out a SCNT=0 value to the jump control multiplexer 288, so that a next state may then be invoked, depending upon the programming of the sequencer WCS 290.

The control decoder 316 receives primary control bits, secondary control bits, and count select values from the writeable control store 290 and decodes these values into specific logical control values which are put out over the control lines shown coming out of the decoder 316 in FIG. 11, including the write gate signal WRGATE and an initialize ECC signal IECC which directly control the ECC syndrome generator 270.

A loop counter 340 is preloaded with a count representing the number of loops to be made during a particular data block transfer, and it maintains a present loop count during the transfer. When the presently loaded loop count increments to zero, a LOOPCNT=0 value is generated by the counter 340. This value indicates that the required number of data blocks has been transferred either to the disk 10 or to the memory 206. This value is provided as one of the inputs to the jump control multiplexer 288.

An index timeout counter 342 keeps track of the number of rotations of the disk by monitoring an index signal from the servo timing and control circuit 232 and puts out an index timeout value INXCNT=0 upon elapse of a programmed number of indexes. The INXCNT=0 value is used to control the sequence controller 300. A once per revolution raw index signal stored in the first one of the servo sectors 38 is detected by the servo control circuit 232 and used to clock the index timeout counter 342.

Other inputs to the sequence controller 300 are the jump value from the jump control multiplexer 288, the address mark found value AMFOUND from the address mark detector 272, and the byte sequence counter SCNT=0 value from the sequence counter 338.

As noted above, the writeable control store 290 includes a random access memory space which may be directly written to and read by the microcontroller 208 via the bus 241 with WCS addresses being held in the address latch 292 and data values being held in the data latch 296.

Further details of the data sequencer are given in commonly ass ending U.S. patent application Ser. No. 07/710,861, Jun. 4, 1991 and entitled "Miniature Disk Drive Having Embedded Sector Servo with Split Data Fields and Automatic On-The-Fly Data Block Sequencing", the disclosure of which is hereby incorporated by reference.

Figure 12:
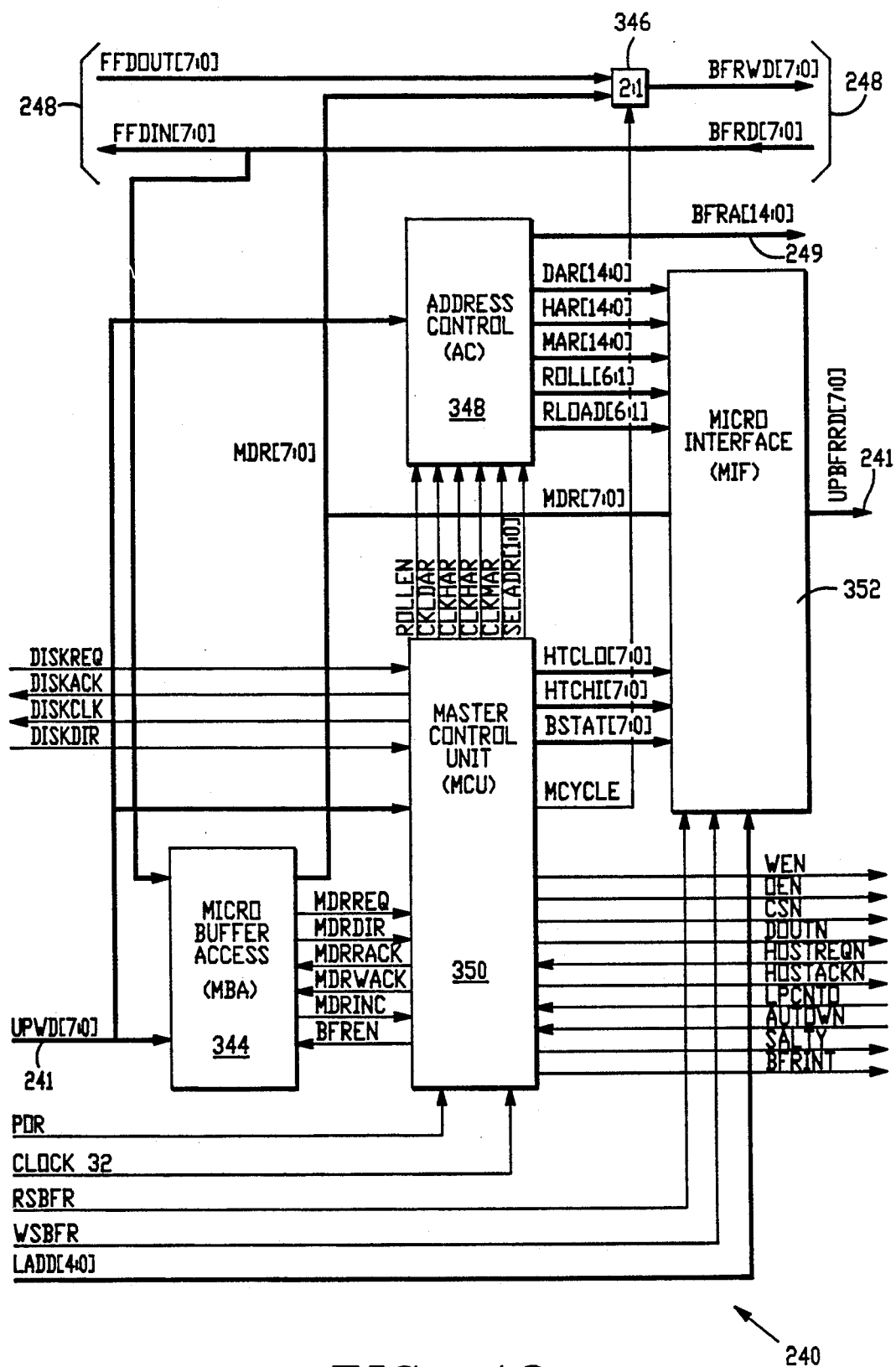
FIG. 12 is a more detailed block diagram of a memory controller subsystem included within the FIG. 8 circuit.

Memory Controller (FIG. 12)

The buffer controller 240 controls operation of the data cache buffer memory 206. While conventional, the buffer controller 240 includes a microcontroller buffer access circuit 344 enabling the microcontroller 208 to write bytes to, and read bytes from, specified addresses in the buffer memory 206 in accordance with values supplied over the bus 241. A multiplexer 346 located within the bus 248 enables microprocessor generated values to be sent to the buffer memory 206. An address control section 348 generates and applies buffer data addresses directly to the buffer memory 206 over the buffer address bus 249. A master control unit 350 generates the necessary control and timing values for clocking data blocks into and out of the buffer memory 206 and supplies those clocks to the address control 348. A microcontroller interface unit 352 selects between inputs from the bus 248 via the multiplexer 346, the address control 348 and the master control unit 350 and sends the selected input back to the microcontroller 208 via the bus 241.

Interface 204 (FIGS. 13A-E)

As noted, the buffer data bus structure 248 interconnects a buffer memory 166 between the FIFO 278 of the data sequencer 232 and a FIFO 360 of the interface circuit 204. The interface circuit 204 includes single ended bus drivers and data receivers for driving and buffering data over the interface bus 251, and it includes other circuitry which will now be described.

The interface circuit 168, while conventional, implements a high level bus-type interface, such as the AT bus, or SCSI bus. A SCSI bus implementation is discussed herein to illustrate details of a preferred example for the interface circuit 204. The SCSI interface 204 is preferably configured to conform to the ANSI standard X3T9.2/82-2 Revision 17B at conformance level 2 for the small computer standard interface ("SCSI"), for example. It is controlled by a SCSI interface service routine executed by the microcontroller 208. The interface 204 includes all of the hardware needed for controlling all critical timing operations on the SCSI interface bus. Decoding of commands, time-outs, and other non-critical timing operations are performed by the SCSI service routine.

Figure 13A:
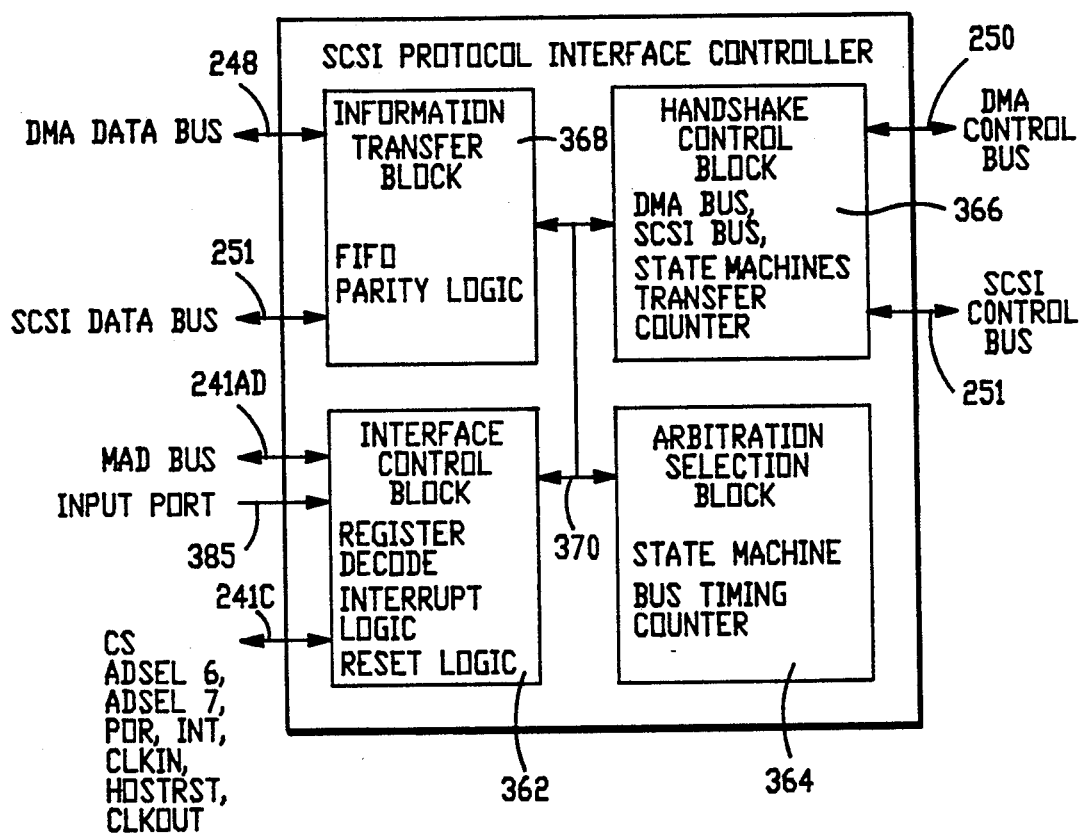
FIG. 13A is a more detailed overall block diagram of an interface subsystem included within the FIG. 7 system illustrating an interface control block, an arbitration selection block, a handshake control block, and an information transfer block.

In order to conform to the ANSI standard noted above, the interface circuit 204 implements eight distinct SCSI bus phases: bus free phase; arbitration phase; selection phase; reselection phase; command phase; data phase; status phase; and, message phase. In order to respond to these phases, the interface circuit 204 includes an interface control block 362, an arbitration selection block 364, a handshake control block 366 and an information transfer block 368. While the blocks have certain external connections as shown in FIG. 13A, they are internally connected together via an internal bus 370. Each block will now be described in turn.

Figure 13B:
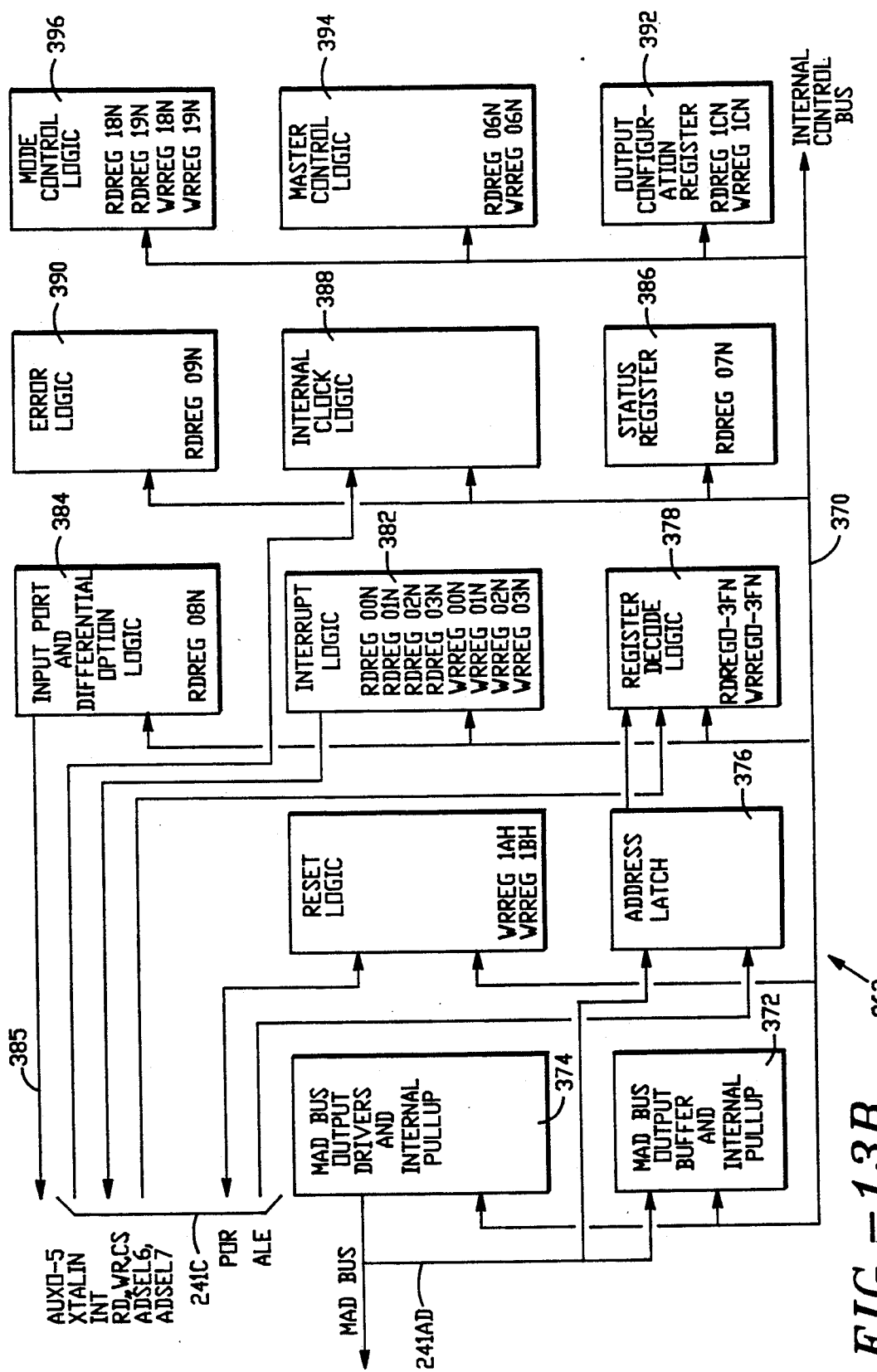
FIG. 13B is a detailed block diagram of the FIG. 13A interface control block.

Turning to FIG. 13B, the interface control block 362 provides direct connections between the microcontroller 208 and the interface 204. The interface control block 362 enables the interface circuit 204 to appear to the microcontroller 208 as an array of directly addressable registers. By writing to these registers, the microcontroller 208 may arbitrate for the SCSI bus 251, select another device on the external bus 251 and initiate data transfers between the storage subsystem 5 and the external host. By reading the directly addressable registers, the microcontroller 208 may determine the status of the interface circuit 204 and of the data transfer process, including error detection.

The interface control block 362 includes an input buffer and internal pullup block 372 which buffers data and addresses incoming from the microcontroller 208 via an address and data portion 241 AD of the microcontroller bus 241. An output leads directly to the internal bus structure 370. Likewise, outgoing data is buffered between the internal bus 370 and the microcontroller bus 241 by an output drivers and internal pullup block 374. An address latch 376 latches addresses of interface registers being read or written by the microcontroller 208. The address latch directly addresses a register decode logic block 378 which decodes each register address within the interface circuit 204. A reset logic block 380 enables the interface circuit 204 to be reset at power on and as commanded under program control.

The interface control circuit also includes an interrupt logic block 382 which enables certain interface control commands and values to be latched and passed onto the microcontroller 208 and handled by the interface modules of the firmware, discussed hereinafter in conjunction with FIG. 14. These controls include BUSY which indicates that the SCSI bus 251 is presently busy; SELECT which is driven by an initiator to select a target or by a target (such as the subsystem 5) to reselect an initiator; CONTROUDATA which is a target driven signal and which indicates whether control or data information is presently on the data bus; INPUT/OUTPUT which is also a target driven signal and which controls the direction in which data moves on the data bus in relation to the initiator and which also distinguishes a selection and a reselection phase; MESSAGE which is a target driven signal during the message phase; REQUEST which is a target driven signal that requests a REQ/ACK data transfer handshake with the initiator; ACKNOWLEDGE which is an initiator driven signal indicating the attention condition; and, RESET which indicates the reset condition.

An input port and differential option logic block 384 supports an auxiliary input/output port 385 which may be used as a general purpose input port or for an external differential SCSI driver array. The interface control block 362 also includes a status register 386, an internal clock logic block 388, and error logic block 390, an output configuration register 392, a master control logic block 394 and a mode control logic block 396.

Figure 13C:
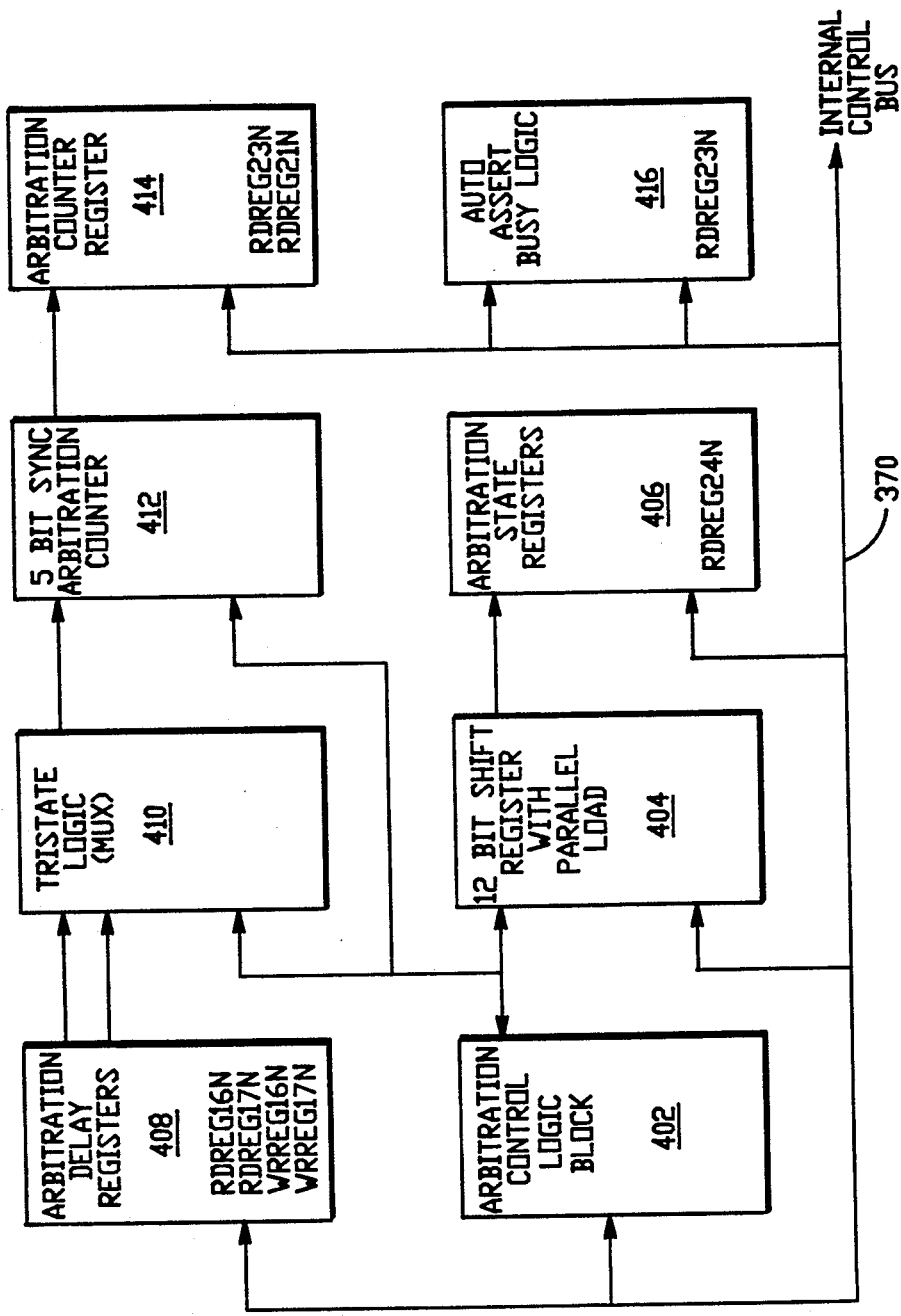
FIG. 13C is a detailed block diagram of the FIG. 13A arbitration selection block.
Figure 13D:
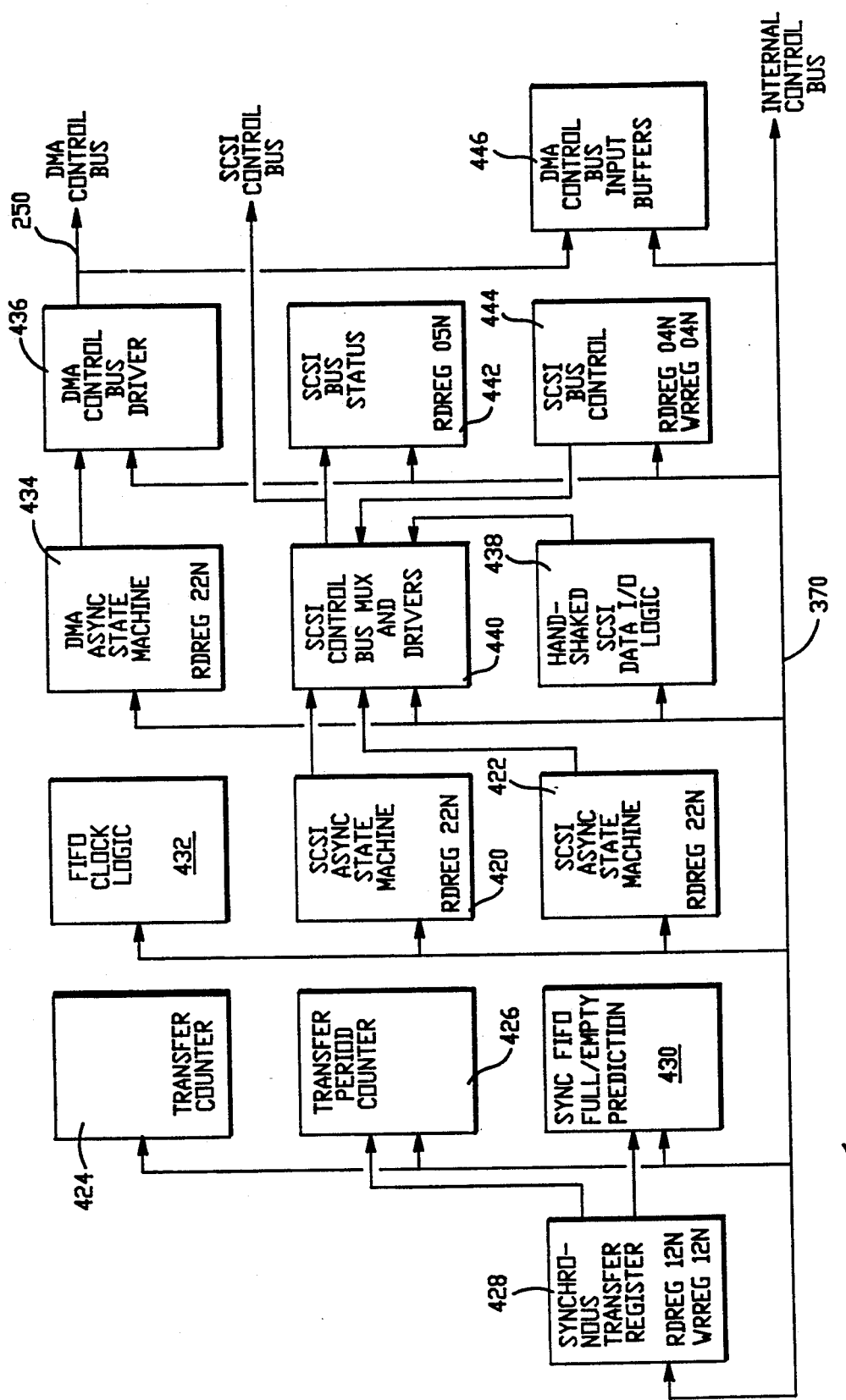
FIG. 13D is a detailed block diagram of the FIG. 13A handshake control block.

An arbitration phase enables one SCSI device to gain control of the SCSI bus 251 in order to assume the role of an initiator or a target. (The data storage system 5 always acts in the role of a target within SCSI). As shown in FIG. 13C, the arbitration selection block 364 includes an arbitration control logic block 402, a 12 bit shift register with parallel load 404, a plurality of arbitration state registers 406, a plurality of arbitration delay registers 408, tristate logic 410, a 5 bit sync arbitration counter 412, an arbitration counter register 414 and an auto assert busy logic circuit 416. The arbitration selection block 364 generates all of the signals needed for the arbitration and selection phase of the SCSI protocol. The auto assert busy state machine 416 generates all of the necessary signals to automatically respond during the selection phase. When enabled, this state machine 416 continuously monitors the SCSI bus 251 to determine if a device is attempting to connect to the disk drive subsystem 5. The microcontroller 208 accesses an arbitration delay register within the block 408 and an arbitration counter register 414, and reads an auto assert busy logic status register within the block 416.

The interface circuit 204 further includes a handshake control logic block 366 enabling data transfer over the SCSI bus 251 in an asynchronous handshake mode via an asynchronous SCSI state machine 420, or in a synchronous handshake mode via a synchronous SCSI state machine 422. This portion of the circuit 204 includes a transfer counter 424 which keeps track of the data bytes being transferred, a transfer period counter 426 which monitors the transfer period, a synchronous transfer register 428 accessible by the microcontroller 208, a synchronous FIFO full/empty prediction circuit 430, a FIFO clock logic circuit for clocking the FIFO 360, the asynchronous and synchronous state machines which contain status registers readable by the microcontroller 208, a buffer memory asynchronous state machine 434 for controlling clocking of information from the FIFO 360 into the buffer 206 also containing a register readable by the microcontroller 208, a buffer memory control bus driver circuit 436 for driving handshake control values from the interface circuit 204 to the memory controller 240 via the internal handshake control bus 250, handshaking logic 438 for data input/output via the external SCSI bus 251, the SCSI control bus multiplexer and driver circuits 440 for handling the control lines of the external SCSI bus 251, a SCSI bus status register 442 readable by the microcontroller 208, and a SCSI bus control register 444 writeable and readable by the microcontroller 208. A buffer memory control bus input buffers circuit 446 buffers incoming control values from the memory controller 240 over the buffer control/interface handshake control bus 250.

The interface circuit 204 further includes an information transfer block 368 (FIG. 13E) including the internal FIFO 360 which buffers data flow between the SCSI bus 251 and the buffer memory 206. The FIFO 360 is arranged as a dual port register bank organized as 8 by 8 bits. The FIFO 360 enables synchronization of data flow with the internal clock operating the buffer controller 240.

Figure 13E:
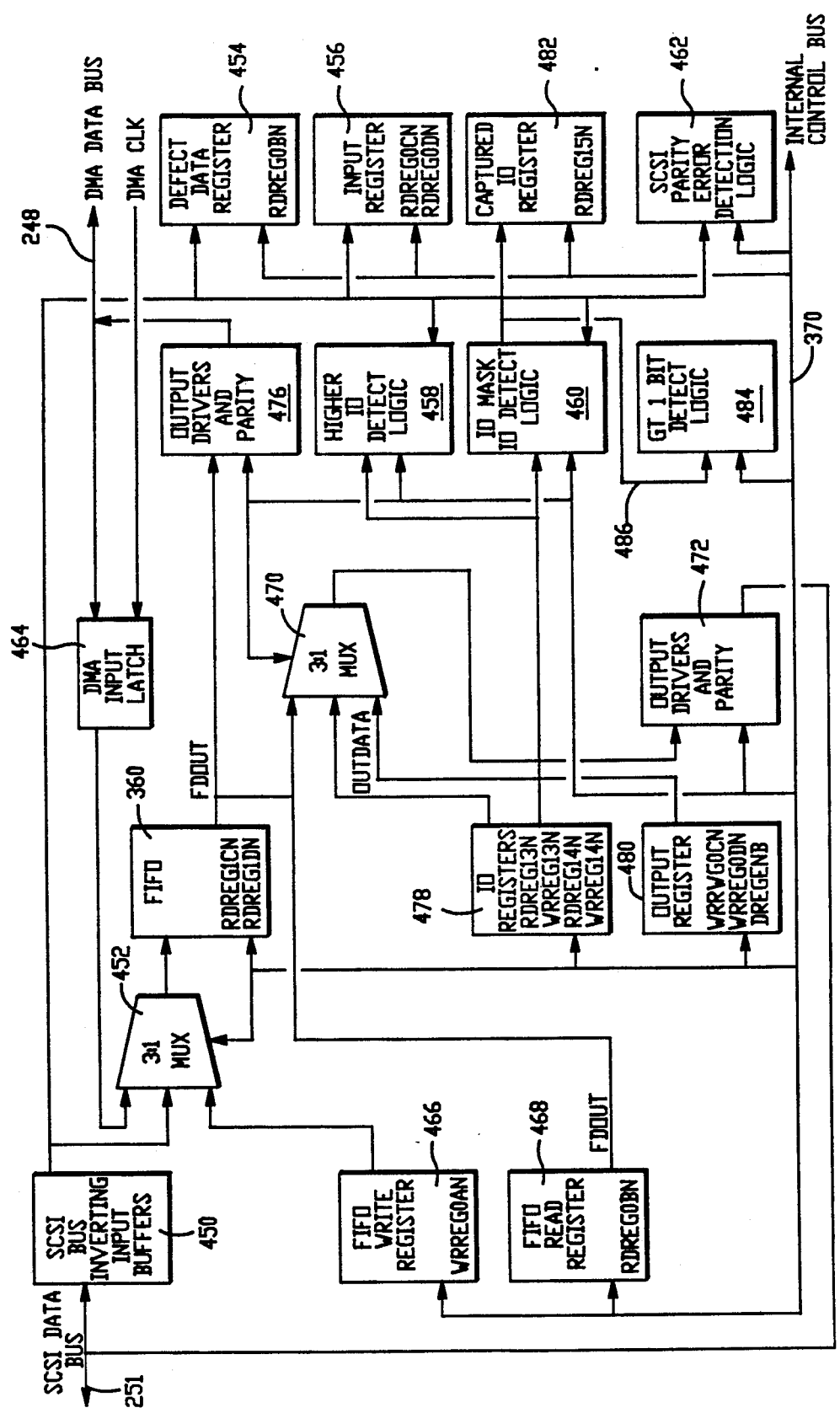
FIG. 13E is a detailed block diagram of the FIG. 13A information transfer block.

The information transfer block 368 includes a SCSI bus inverting input driver circuit 450 which buffers incoming information from the external SCSI bus 251 and circulates this information within the transfer block 368 as shown in FIG. 13E. One of the circuits fed by the inverting input driver circuit 450 is a three to one multiplexer 452 which directly feeds into the FIFO 360. Other circuits connected to the driver circuit 450 include a defect data register 454, an input register 456, a higher ID detect logic circuit 458, an ID mask and ID detect logic circuit 460, and a SCSI parity error detection logic circuit 462.

Data from the buffer memory 206 is passed through a DMA input latch 464 and the multiplexer 452 in order to reach the FIFO 360. The DMA input latch 464 is controlled by a DMA clock signal provided by the memory controller 240. Another input to the multiplexer 452 is provided by a FIFO write register 466 which enables the microcontroller 208 to write directly to a byte position of the FIFO 360 so as to be able to communicate directly with the host. Similarly, data from the FIFO being sent on to the host may also be written into a FIFO read register 468 and thereupon read by the microcontroller 208.

Data leaving the FIFO 360 passes either to the register 468, or through a second three to one multiplexer 470 which leads through an outgoing data drivers and parity logic circuit 472 feeding the SCSI bus 251, or an incoming data drivers and parity logic circuit 476 leading directly to the buffer memory data bus 248. Other inputs to the second three to one multiplexer 470 include connections from an ID registers block 478, and an output register 480. The ID registers block 478 also connects to the higher ID detect logic 458 and to the ID mask and ID detect logic block 460. The ID mask and ID detect logic block connects to a captured ID register 482 and also to a Get 1 Bit logic block 484 via an internal path 486.

Figure 14:
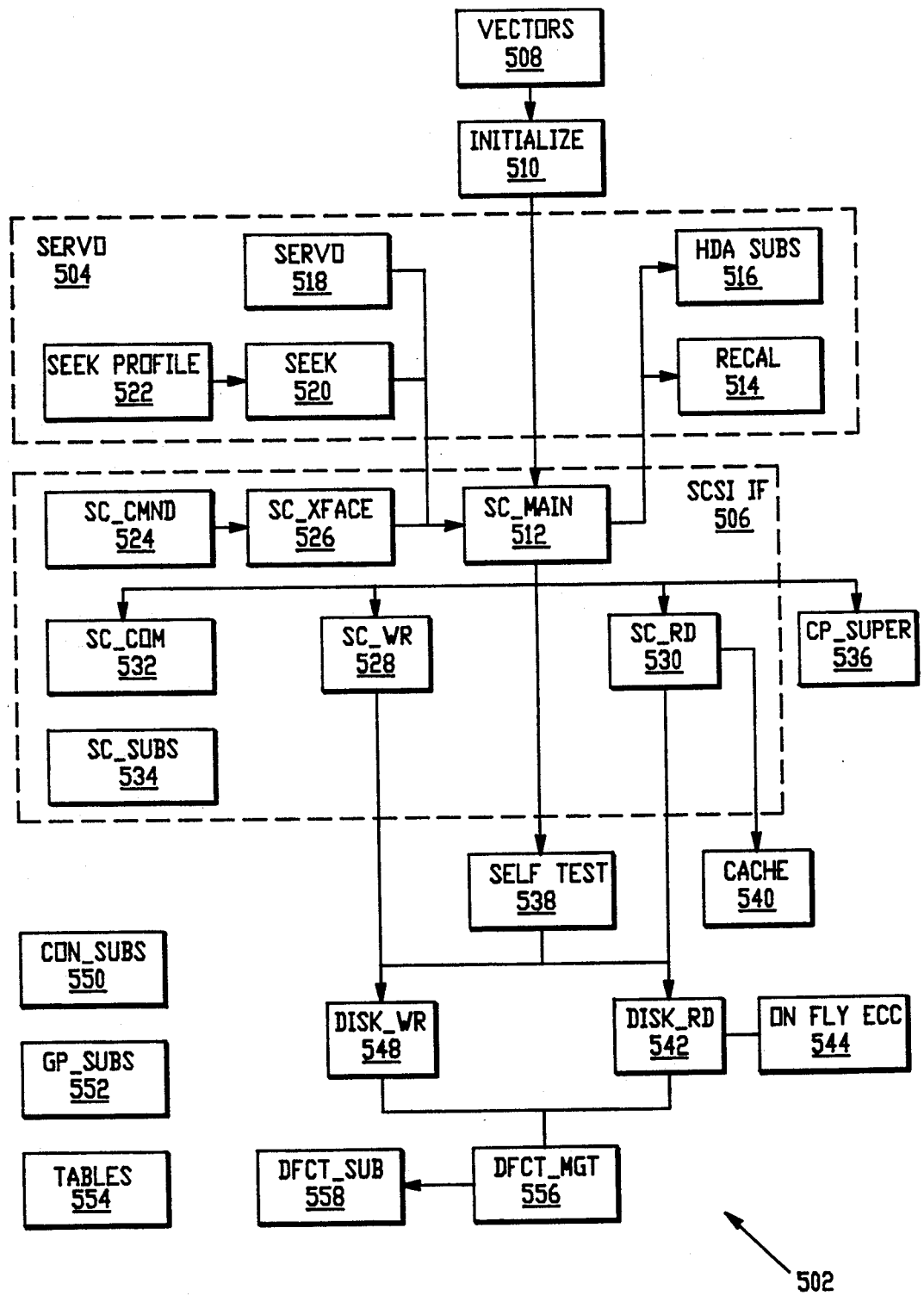
FIG. 14 is a block diagram illustrating overall arrangement and organization of firmware modules comprising a control program for controlling operation of the disk drive of the present invention.

Control P rams (FIG. 14)

Preferably although not necessarily, the programmed microcontroller 162 is a single monolithic microcontroller such as the NEC 78322, or equivalent, operating in a two-phase time divided arrangement per servo sector wherein a first time interval upon the arrival of each servo sector is devoted to servo control operations for head positioning, with a second and following time interval devoted to other tasks, including error correction operations, for example. An overview of this form of disk drive architecture including the digital embedded servo is provided in the referenced U.S. Pat. No. 4,669,004. A hierarchical system for managing the tasks performed by the microcontroller 162 during the second and following time interval is disclosed in the referenced U.S. Pat. No. 5,005,089.

The analog to digital converter 209 within the microcontroller 162 enables the A and B or C burst peak values detected by the peak detectors 132 selectively to be digitized and processed most preferably in accordance with a method described in the referenced U.S. Pat. No. 5,170,299, reference to which is made for further particulars.

With reference to FIG. 14, sections and modules comprising an overall firmware control program 500 are shown in overview. Essentially, there are three separate sections: a hardware dependent section 502, a servo section 504 and an interface section 506. The servo section 504 and the interface section 506 are shown enclosed within dashed line blocks, leaving the remaining modules within the hardware section 502. By arranging the firmware 500 in this fashion, universal servo and interface modules may be generated and used within a variety of differing disk hardware environments. In particular, this approach facilitates configuring the subsystem 5 with either the SCSI interface 204, or with an AT or other style interface, merely by replacing the modules of the interface section 506. The interface modules of the interface section 506 are preferably kept in the outboard program memory 210, so that the selection of either a SCSI interface and an AT interface merely requires selecting the proper interface chip and the appropriate interface firmware section 506.

The firmware begins with a vectors module 508 which includes interrupt vectors for the NEC 78322 processor. This processor 208 has two interrupt vector locations, 0000H and 8000H, and vectors are established at both locations by the module 508. This module 508 also includes some initialization code for the microcontroller 208, such as informing it of the existence of the external program memory 210 and setting up wait states.

A jump table in the vectors module 508 is located within external program memory of the microcontroller 208. This readily alterable, external table is used to enable program code in the internal program memory to go to program code which is in the external program memory 210 and which may change in address location as the code evolves throughout the useful life of the disk drive. Anytime the controller 208 proceeds from internal program memory to the external program memory 210 an intermediate instruction is invoked which is a branch instruction. The location of the branch instruction is fixed, but the location of the second branch instruction is not fixed and may move around within the external memory 210. There are three groups of hard addresses, 0000H and 8000H are the vector locations, and 4000H is the beginning of the external program memory contained in the EPROM 210. This arrangement means that although the internal program memory code is fixed, the external program memory remains changeable and adaptable, thereby adding flexibility to the subsystem 5.

An initialization module 510 performs a number of initialization steps, such as clearing out the random access memory space directly addressed and contained within the microcontroller 208. It also performs some tests upon the writeable control store 290 and downloads an initial microprogram to be executed by the sequencer 238. It also sets up other registers and values within the sequencer and control ASIC 202 and within the interface ASIC 204. It also performs some checks upon the internal and external program memories. It sizes the external buffer memory 206 as being either 8 or 32 kilobytes capacity and sets up some variables based upon buffer size. At the completion of the initialization routine 510, the subsystem 5 is beginning to function, although the spindle motor 114 is not yet energized, the head position servo is not yet calibrated, and the interface 204 is not yet able to accept any commands from the host system.

At this point a main loop, such as SCSI main 512 is called (an AT main loop would be called in the AT interface implementation) which immediately points to the servo section 504. A recal module 514 in the servo section 504 is called which contains a table which points to a series of subroutines which are used to spin up the spindle motor 114. While the spindle motor is spinning up a buffer memory test is carried out, and a HDA subroutines module 516 is called in order to initialize the head and disk assembly. A servo initialization is performed including the FINDMODE which enables the servo state machine 232 to determine the location of the embedded servo sectors 38. A ram variable in the table within the recal module 514 is progressively advanced, so that all of the head and disk subroutines contained in the HDA subs module 516 are invoked as required to bring up the subsystem 5. Each of the HDA subroutines in the module 516 requires less than about 250 microseconds to execute, so that any interface command received from the interface 204 may be decoded and interrupt the recal operation. As part of the recalibration operation, a defect map is read from one of the diagnostics tracks of the disk 10. The HDA subs module 516 is performed during a main time, and not during the interrupt time at which a selected head 316 is passing over a servo sector 38.

During a servo sector interrupt, either a servo module 518 or a seek module 520 will be called from the main routine 512, depending upon whether the head and disk assembly is following a track, or is seeking or settling to a track. A velocity profile table for seeking is contained in a profile module 522 which is accessed by the seek module during track seeking operations Preparatory to a seek the seek module 520 calculates the values which will be used to govern a seek and sets up a seek profile so that at a next servo interrupt, a seek mode is invoked and the seek is carried out. Monitoring routines, such as seek timeout, are also contained in the HDA subs module 516, to determine if a seek timeout has occurred without reaching the destination track, or if a seek error has occurred, a retry will be attempted.

A SCSI command decode module 524 decodes incoming SCSI commands and tests to determine if a command is legal. Incoming commands are passed through a SCSI interface module 526 to the command decode module 524. Associated with the command will be appended the address of a routine which executes the particular command. Once the SCSI command is decoded and passed via the interface module 526 to the SCSI main module 512, one of a plurality of SCSI firmware command execution modules will be called. These modules include a SCSI write module 528, a SCSI read module 530, and a SCSI other command module 532 which executes all SCSI commands other than a read or write. A SCSI subroutines module 534 contains subroutines which may be called from the read, write or other modules, for example.

General purpose superset routines are contained in a module 536. These routines are hardware dependent and are located in the hardware section 502, although they are called from the SCSI main module 512. They essentially comprise drive test and diagnostic routines, such as a routine for informing the host of the identity of the current physical cylinder address at which the rotary actuator is positioned. Another superset routine causes the contents of the microcontroller's internal random access memory to be read out. A further superset routine enables the microcontroller RAM to be directly written. Access to the general purpose superset module 536 is restricted and requires that a unique key be provided via the interface 204 before becoming active.

A self test module 538 is invoked by a test setup, such as a special SCSI connector, or a jumper located on the printed circuit board 110. Self test may also be invoked by a host command from the SCSI main module 512.

A cache module 540 is associated with the SCSI read module 530. If a SCSI read command is decoded, before a seek is made to the data storage location, the cache module 540 is examined to see if the data being sought already resides in the cache memory 206. If it does, the data is transferred from the cache buffer memory directly to the host via the interface 204. If the data is not in the cache memory, as determined at the cache firmware module 540, a cache memory segment is set aside for the data, and the SCSI read module 530 then directly interacts with a disk read module 542. With a cache memory sized to 8 kilobytes, only one segment is available. If the cache memory is 32 kilobytes, there are two segments available for caching. A larger cache memory 206 increases average data throughput rates between the subsystem 5 and the host system.

The SCSI read module 530 fields a SCSI read command received from the interface ASIC 204 by calling hardware specific read subroutines contained in the disk read module 542. The SCSI read module 530 includes a SCSI read monitor routine which supervises the calls made to the various hardware routines contained in the disk read module 542 and elsewhere within the hardware section 502 of the firmware. An error correction code module 544 is called from the disk read module 542 and carries out on-the-fly error correction of data burst errors as explained in the referenced copending parent patent application Ser. No. 07/650,791 filed on Feb. 1, 1991.

Similarly, the SCSI write module fields write commands received from the SCSI interface 204 by invoking hardware specific write routines contained in a disk write module 548. The SCSI write module 528 also includes a small monitor which supervises the calls to the various subroutines included within the disk write module 548.

The SCSI main routine 512 includes a more simplified monitor routine which supervises read caching (prefetching) and write caching operations. Accordingly, there are direct links between the SCSI main module 512 and both the disk read module 542 and the disk write module 548. However, there is no direct interface activity associated with either prefetch or write caching, as these are prediction algorithms developed to predict future interface commands, not present commands. (Prefetching is a process of anticipating future host data read requests by prestoring data blocks in the cache buffer. Write caching is the process of storing data in the cache buffer 206 and informing the host that the data has already been written to disk, while the head and disk assembly is in the process of seeking to, and settling at, the write data location on the disk. Prefetching and write caching enable very fast data transfer operations between the subsystem 5 and the host system, and result in an overall improved average data throughput of the subsystem 5.)

A controller subroutines module 550 contains a number of routines which specifically service the data sequencer and control ASIC 202. These routines include the functional sequences which are loaded into, and executed by, the sequencer WCS 290 which set up the sequencer states for read and write, format, read ID, etc. For example, during an initialization routine, the read and write code is downloaded to the WCS 290 and a variable in the firmware is set to a value indicating that this code is in place. Later on, during a data read or write operation, this variable is checked by the firmware to be sure that the WCS remains loaded with the program sequences needed for reading and writing. If it turns out that the correct routine is not presently loaded into the WCS 290, then the desired WCS routine is transferred from the module 550 to the WCS via the microcontroller bus 241.

During actual read and write operations, a routine is required to patch current data into the data field of the WCS, such as head number (which indicates data storage surface to which data is to be written or from which data is to be read).

A general purpose subroutines module 552 contains certain general purpose subroutines which are not specific to any other module or function. A tables module 554 contains the error decoding tables for internal error conditions, templates for the inquiry data, and initial default values for e.g. mode sense, mode select data. A number of tables in the tables module 554 map the locations of the many variables required by the firmware 500 as to whether a variable is located in the buffer 206 or whether they are to be found in the internal microcontroller RAM.

A defect management module 556 is accessed directly by the disk write module 548 and also directly by the disk read module 542. The defect management scheme employed in the subsystem 5 makes use of the buffer 206 in order to reroute data to and from a defective sector location and a spare sector location on the disk. A defect subroutines module 558 includes defect management routines which are called from the defect management module 556.

The microfiche appendix to this application contains program routines for the internal program memory of the microcontroller 208 as well as complementary program routines for the external program memory 210. In addition, schematic circuit drawings for the circuit board 110 and for the data sequencer 238 are also included.

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are by way of illustration only and should not be construed as limiting the scope of the present invention which is more particularly pointed out by the following claims.

What is claimed is:

1. A Winchester disk drive data storage subsystem for connecting with a host computing system, the data storage subsystem including a head and disk assembly defining a disk spindle, a brushless DC spindle motor formed at said spindle for rotating a disk hub at a constant angular velocity, at least one rotating disk mounted to said hub and having two data storage surfaces defining a plurality of concentric data storage track locations having a track density of at least approximately 1700 tracks per inch, a data transducer head for each surface, the heads being radially positionable among the track locations, a mass balanced rotary voice coil actuated head positioning system for moving the data transducer heads between track locations during track seeking and settling and for maintaining a selected one of the data transducer heads in alignment with centerline of a track during track following operations during which data blocks are written to or read from the track being followed, the storage surfaces defining a series of radially extensive servo sectors embedded within circumferential zones of data tracks, the sectors being recorded at a constant data transfer rate and each sector including servo information comprising a track number value and a plurality of radially offset and circumferentially staggered servo bursts, each zone having a data transfer rate adapted to disk radius, and read preamplifier, write driver, head select integrated circuit means connected for selecting each said data transducer head, for amplifying analog signals read from a said data storage surface, and for amplifying signals to be written to said surface, the disk drive subsystem further comprising subsystem electronics mounted on a circuit board and including:

read channel means connected to said read preamplifier, write driver and head select integrated circuit means for processing said analog signals into digital signal transitions, and including pulse detector means for detecting said analog signals, phase locked loop means for generating a digital read data clock synchronized detected analog signals, and frequency synthesizer means for generating frequency signals for the phase locked loop means in relation to the data transfer rate of each data zone, servo processing means connected to said read channel means for locating and processing said servo information located within each said servo sector into head position digital values, data block sequencer means connected to said read channel means for locating and assembling data blocks from a serial data stream read from, and for forming and sending a serial data stream to, the data storage surfaces and for handling data block transfers between the disk storage surfaces and a buffer memory means, buffer memory control means for handling transfers between the buffer memory means and a bus level interface means, the bus level interface means for transferring data blocks and control values between the host computing system and the subsystem via a bus level interface structure, the buffer memory means connected to said data block sequencer means and to said bus level interface means and controlled by said buffer memory control means for temporarily storing blocks of data passing between the subsystem and the host computing system, and programmed digital controller means connected to said read channel means, said servo processing means, said data block sequencer means said buffer memory control means and said bus level interface means, and including servo supervision routine means for supervising operations of the servo processing means by generating and applying digital head position correction values to the head positioning system from said head position digital values generated by said servo processing means, and including data block transfer supervision routine means for supervising operations of said data block sequencer means, said buffer memory control means and said bus level interface means.

2. The Winchester disk drive data storage subsystem set forth in claim 1 wherein said subsystem comprises a single data storage disk having a diameter not substantially greater than 2.5 inches and capable of storing in excess of forty megabytes of formatted data on two data storage surfaces, and wherein the subsystem is included entirely within a form factor in a horizontal orientation of a height substantially not greater than 0.61 inch, a width substantially not greater than 2.76 inches, and a depth substantially not greater than 3.94 inches.

3. The Winchester disk drive data storage subsystem set forth in claim 1 wherein said subsystem comprises two data storage disks mounted in spaced apart relation on said hub, each disk having a diameter not substantially greater than 2.5 inches and capable of storing in excess of forty megabytes of formatted data on two data storage surfaces thereof having a track density, and wherein the subsystem is included entirely with a form factor in a horizontal orientation of a height substantially not greater than 0.75 inch, a width substantially not greater than 2.76 inches, and a depth substantially not greater than 3.94 inches.

4. The Winchester disk drive data storage subsystem set forth in claim 1 wherein a stator portion of said DC brushless spindle motor and a stator portion of said mass balanced rotary voice coil actuated head positioning system are formed integrally with a base of said head and disk assembly.

5. The Winchester disk drive data storage subsystem set forth in claim 1 wherein said data sequencer means codes said data stream into a three to two 1,7 RLL code for transfer to said data storage disk, and decodes said data stream from said data storage surface from said 1,7 RLL code to uncoded data.

6. The Winchester disk drive data storage subsystem set forth in claim 1 wherein said servo supervision routine means and said data block transfer supervision routine means are organized as modules such that modules directly relating to control of said bus level interface means may be replaced with modules directly relating to control of another type of bus level interface means, without need for replacing any other modules of said supervision routine means.

7. A submicro-Winchester disk drive data storage subsystem including a bus-level interface means for connecting with a host computing system, the data storage subsystem including a head and disk assembly including a disk spindle means and rotating hub and a brushless DC spindle motor formed at said spindle means and hub, at least one rotating disk mounted to said hub and having a diameter not substantially greater than 2.5 inches and capable of storing in excess of forty megabytes of formatted data on two data storage surfaces defining a plurality of concentric data storage track locations having a track density of at least approximately 1700 tracks per inch, a data transducer head for each surface, the heads being radially positionable among the track locations, a mass balanced rotary voice coil actuated head positioning system for moving the data transducer heads between track locations during track seeking and settling and for maintaining a selected one of the data transducer heads in alignment with centerline of a track during track following operations during which data blocks are written to or read from the track being followed, the storage surfaces defining a series of radially extensive servo sectors embedded within a plurality of circumferential zones of data tracks and prerecorded with track locating and track centering information, each zone having a data transfer rate adapted to disk radius, the servo sectors interrupting the data tracks at predetermined spaced apart circumferential locations across a data storage surface areas of the disk and thereby splitting at least some of the data blocks into segments, and read preamplifier, write driver, head select integrated circuit means connected for selecting each said data transducer head and for amplifying analog signals read from or to be written to a said data storage surface, the disk drive subsystem further comprising subsystem electronics mounted on a circuit board and including:

read channel means including pulse detector means, phase locked loop means and frequency synthesizer means for processing said analog signals into digital signal transitions, servo processing means connected to said read channel means for locating and processing said track locating and track centering information located within each servo sector to provide head position digital values, data block sequencer means for locating and assembling data blocks read from and written to the data storage surfaces as segments and for handling data block transfers between the disk storage surfaces and a buffer memory means, buffer memory control means for handling transfers between the buffer memory means and the data block sequencer means, and between the buffer memory means and the bus level interface means, said bus level interface means for transferring data blocks and control values between a host computing system and the subsystem via a bus level interface structure, the buffer memory means connected to said data block sequencer means and to said bus level interface means for temporarily storing blocks of data passing between the subsystem and the host computing system, and programmed digital controller means connected to said read channel means, said servo processing means, said data block sequencer means, said buffer memory control means and said bus level interface means and including servo supervision routing means for supervising operations of the servo processing means by generating and applying digital head position correction values to the head positioning system from said head position digital values generated by said servo processing means, and including data block transfer supervision routine means for supervising operations of said data block sequencer means, said buffer memory control means and said interface means.

8. The submicro-Winchester disk drive data storage subsystem set forth in claim 7 wherein each data block storage location defined on a said disk surface includes an ID field containing block segment counts indicative of the spatial arrangement of said block, and wherein said sequencer means is directly responsive to said block segment counts automatically to locate and assemble data blocks read from and written to the data storage surfaces.

9. The submicro-Winchester disk drive data storage subsystem set forth in claim 7 wherein said circuit board further includes spindle motor driver means for driving said brushless DC spindle motor.

10. The submicro-Winchester disk drive data storage subsystem set forth in claim 7 further including spindle motor driver means and spindle motor speed monitor means connected to said spindle motor driver means in order to monitor and regulate disk rotational speed at a predetermined constant angular velocity.

11. The submicro-Winchester disk drive data storage subsystem set forth in claim 7 further including single master clock means for generating and supplying clocking signals throughout said subsystem electronics.

12. The submicro-Winchester disk drive data storage subsystem set forth in claim 7 wherein each said servo sector includes a plurality of radially offset circumferentially sequential burst fields for providing track centerline information, and further including peak detector means selectively connected to a selected data transducer head through said read preamplifier, write driver and head select integrated circuit means during passes over said servo sector by said head, and wherein said microcontroller means comprises analog to digital conversion means for converting relative amplitude values obtained from reading said bursts into digital values.

13. The submicro-Winchester disk drive data storage subsystem set forth in claim 7 further including pulse width modulator means for putting out head position control signals as a series of variable duty cycle pulses, and further comprising low pass filter means and servo driver means connected in said head positioning system for receiving and filtering said variable duty cycle pulses and converting them into driving currents applied to said rotary actuator.

14. The submicro-Winchester disk drive data storage subsystem set forth in claim 7 wherein said microcontroller means includes an internal program memory means having some prestored control routines therein, and further comprising external program memory mean containing other prestored control routines.

15. A submicro-Winchester disk drive data host computing system including a bus-level interface means for connecting with a host computing system, the data storage system including a head and disk assembly including a disk spindle means having a rotating hub and brushless DC spindle motor means formed at said spindle means and hub, at least one rotating disk mounted to said hub and having a diameter not substantially greater than 2.5 inches and capable of storing in excess of forty megabytes of formatted data on two data storage surfaces each defining a plurality of concentric data storage track locations having a track density of at least approximately 1700 tracks per inch, a data transducer head for each surface, the heads being radially positionable among the track locations, a mass balanced rotary voice coil actuated head positioning system for moving the data transducer heads between track locations during track seeking and settling and for maintaining a selected one of the data transducer heads in alignment with centerline of a track during track following operations during which data blocks are written to or read from the track being followed, the storage surfaces defining a series of radially extensive servo sectors embedded within radially spaced apart circumferential zones of data tracks and prerecorded with track locating and track centering information at a constant data transfer rate, each zone having a data transfer rate adapted to disk radius, the servo sectors interrupting the data tracks at predetermined spaced apart circumferential locations across data storage surface areas of the disk and thereby splitting at least some of the data blocks into segments, each data block having a header field containing count byte information describing the lengths of the segments thereof, and read preamplifier-write driver-head select integrated circuit means connected for selecting each said data transducer head and for amplifying analog signals read from to be written to a said data storage surface, the disk drive subsystem further comprising subsystem electronics mounted on a circuit board and including:

first integrated circuit means connected to said read preamplifier-write driver-head select integrated circuit means and comprising read channel means including pulse detector means, phase locked loop means and frequency synthesizer means, for processing said analog signals into digital signal transitions, second integrated circuit means connected to said first integrated circuit means and including:
  servo processing means for locating and processing said track locating and track centering information located within each said servo sector into digital servo head position information,
  data block sequencer means for locating and assembling data blocks read from and written to the data storage surface directly in response to the count byte information and for handling data block transfers between the disk storage surfaces and a buffer memory means,
  buffer memory control means for handling transfers between the buffer memory means and the interface, third integrated circuit means connected to said second integrated circuit means and including said bus level interface means for transferring data blocks and control values between the host computing system and the subsystem via a bus level interface arrangement, the buffer memory means being connected to said second and third integrated circuit means for temporarily storing blocks of data passing between the subsystem and the host computing systems, and programmed digital controller means connected to said first, second and third integrated circuit means via a control bus structure means, and including servo supervision routine means for supervising head positioning operations in response to the digital servo head position information processed by the servo processing means and in response to information received via the bus level interface means, and including data block transfer supervision routine means for supervising operations of said data block sequencer means, said buffer memory control means and said interface means.

16. The submicro-Winchester disk drive data storage subsystem set forth in claim 15 wherein said circuit board further includes spindle motor driver means for driving said brushless DC spindle motor, said spindle motor driver means being controlled by said programmed digital controller means.

17. The submicro-Winchester disk drive data storage subsystem set forth in claim 16 wherein said third integrated circuit means includes spindle motor speed monitor means connected to said spindle motor driver means for monitoring disk rotational speed and maintaining it at a predetermined constant angular velocity.

18. The submicro-Winchester disk drive data storage subsystem set forth in claim 15 wherein said third integrated circuit means further includes single master clock means for generating and supplying clocking signals to said second and fourth integrated circuit means and to said digital controller means.

19. The submicro-Winchester disk drive data storage subsystem set forth in claim 15 wherein the track centering information in each said servo sector comprises a plurality of radially offset circumferentially sequential burst fields for providing track centerline information, and wherein said first integrated circuit means further includes peak detector means selectively connected to a selected data transducer head through said read preamplifier-write driver-head select integrated circuit means during passes over said servo sector by said head, and wherein said digital controller means includes analog to digital conversion means for converting relative amplitude values obtained from reading said bursts into digital values.

20. The submicro-Winchester disk drive data storage subsystem set forth in claim 15 wherein said second integrated circuit means further includes pulse width modulator means for putting out head position control signals as a series of variable duty cycle pulses, and further comprising low pass filter means and servo driver means connected in said head positioning system for receiving and filtering said variable duty cycle pulses and converting them into driving currents applied to said rotary actuated head positioning system.

21. The submicro-Winchester disk drive data storage subsystem set forth in claim 15 wherein said digital controller means includes an internal program memory means having some prestored control routines therein, and further comprising external program memory means containing other prestored control routines.

22. The submicro-Winchester disk drive data storage subsystem set forth in claim 15 wherein said servo supervision routine means and said data block transfer supervision routine means are organized as modules such that modules directly relating to control of said bus level interface means may be replaced with modules directly relating to control of another type of bus level interface means, without need for replacing any other modules of said supervision routine means.

23. A monolithic very large scale (VLSI) integrated circuit for a disk drive data storage subsystem including a disk rotating at a controlled, substantially constant angular velocity and having data storage surfaces defining a series of radially extensive servo sectors embedded within radially spaced apart circumferential zones of data tracks and prerecorded with track locating and track centering information at a constant data transfer rate, each zone having a data transfer rate adapted to disk radius, the servo sectors interrupting the data tracks at predetermined spaced apart circumferential locations across data storage surface areas of the disk and thereby splitting at least some of the data blocks into segments, each data block having a header field containing count byte information describing the lengths of the segments thereof, a head for reading data from a said track and for writing data to a said track, the head being positioned by a head positioning mechanism operating from the digital head location and centering information within a digital head position servo loop including a programmed digital microcontroller, the subsystem further comprising read/write channel means extending between the integrated circuit and the head for processing analog signals comprising the data read by the head into a digital data stream, buffer memory means connected between the integrated circuit for temporary storage of data blocks in transit between storage locations on the disk and an interface circuit means, the interface circuit means for connecting the subsystem and the buffer memory means with a host computing system via a bus level interface, the monolithic VLSI integrated circuit comprising:

programmable data sequencer means for locating and automatically assembling data blocks from the digital data stream comprising said segments read from the disk in accordance with said count byte information, and for forming and sending to the read/write channel means a serial digital data stream of data blocks to be written in segments to the disk in accordance with said count byte information, at defined data block storage locations thereof, memory controller means for generating and putting out addresses to the buffer memory means for enabling the buffer memory means to transfer data blocks to and from the sequencer means and to and from the interface circuit means, digital servo decoder means for decoding said track locating information read by said head and for putting out digital head location values to said programmed microcontroller means, and microcontroller interface means for enabling said programmed microcontroller means to have direct access to storage locations of said integrated circuit for storing control values for said data sequencer means, memory controller means and digital servo controller means.

24. The monolithic VLSI integrated circuit set forth in claim 23 wherein said information embedded in said servo sectors includes in one of said servo sectors a unique index pattern denoting a once-per-revolution index marker, and wherein said digital servo decoder means of said chip includes index pattern decoding means for decoding said unique index pattern into said index marker, and said chip further includes disk rotational speed monitoring and adjustment means responsive to means for sensing disk rotational velocity for generating speed up and slow down control signals for controlling a spindle motor driver circuit means.

25. The monolithic VLSI integrated circuit set forth in claim 23 further comprising pulse width modulator means controlled by said programmed microcontroller means for generating servo control pulses of controlled duration and applying said control pulses to a servo actuator driver circuit within said head positioner.

26. The monolithic VLSI integrated circuit set forth in claim 23 further comprising programmable master clock means for generating programmable clocking signals for controlling operation of said microcontroller means, said memory controller means and interface state machine means within said interface circuit means.

27. The monolithic VLSI integrated circuit set forth in claim 23 wherein said data sequencer means further comprises encoder/decoder means for encoding and decoding user data values into and from a predetermined zero run length limited code.

28. The monolithic VLSI integrated circuit set forth in claim 27 wherein the predetermined zero run length limited code comprises a 1,7 RLL code.

29. The submicro-Winchester disk drive data storage subsystem set forth in claim 7 wherein said subsystem comprises a single data storage disk and is included entirely within a form factor including the circuit board in a horizontal orientation of a height substantially not greater than 0.61 inch, a width substantially not greater than 2.76 inches, and a depth substantially not greater than 3.94 inches.

30. The submicro-Winchester disk drive data storage subsystem set forth in claim 7 wherein said subsystem comprises two data storage disks mounted in spaced apart relation on said hub and is included entirely within a form factor including the circuit board in a horizontal orientation of a height substantially not greater than 0.75 inch, a width substantially not greater than 2.76 inches, and a depth substantially not greater than 3.94 inches.

* * * * *